United States Patent
Kubo et al.

(10) Patent No.: US 11,404,265 B2
(45) Date of Patent: Aug. 2, 2022

(54) FILM DEPOSITION METHOD

(71) Applicant: Tokyo Electron Limited, Tokyo (JP)

(72) Inventors: Kazumi Kubo, Iwate (JP); Takayuki Karakawa, Yamanashi (JP); Yutaka Takahashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 189 days.

(21) Appl. No.: 16/750,205

(22) Filed: Jan. 23, 2020

(65) Prior Publication Data
US 2020/0243330 A1  Jul. 30, 2020

(30) Foreign Application Priority Data
Jan. 30, 2019  (JP) .............................. JP2019-014764

(51) Int. Cl.
*H01L 21/31* (2006.01)
*H01L 21/02* (2006.01)
(Continued)

(52) U.S. Cl.
CPC ...... *H01L 21/02274* (2013.01); *C23C 16/345* (2013.01); *C23C 16/401* (2013.01);
(Continued)

(58) Field of Classification Search
CPC .......... H01L 21/0217; H01L 21/02178; H01L 21/02186; H01L 21/02205;
(Continued)

(56) References Cited

U.S. PATENT DOCUMENTS

| 5,178,682 A | 1/1993 | Tsukamoto et al. |
| 7,504,681 B2 | 3/2009 | Lim |

(Continued)

FOREIGN PATENT DOCUMENTS

| JP | 2000-174007 | 6/2000 |
| JP | 2004-281853 | 10/2004 |

(Continued)

OTHER PUBLICATIONS

Oh et al. "Accurate Measurement of Atomic Chlorine Radical Density in Process Plasma with Spatially Resolvable Optical Emission Spectrometer" (2015). International Journal of Precision engineering and Manufacturing vol. 16, No. 8. pp. 1919-1924 (Jul. 2015).

*Primary Examiner* — Brook Kebede
(74) *Attorney, Agent, or Firm* — IPUSA, PLLC

(57) ABSTRACT

A film deposition method is provided. In the method, chlorine gas is activated in a plasma generator, and an adsorption inhibitor group is formed by adsorbing the activated chlorine gas on a surface of a substrate in a processing chamber. A source gas containing chlorine and one of silicon and a metal is adsorbed on a region without the adsorption inhibitor group of the surface of the substrate, and a nitride film is deposited by supplying a nitriding gas to the surface of the substrate and causing the nitriding gas to react with the source gas. The substrate on which the nitride film is deposited is carried out of the processing chamber, and an inside of the plasma generator is purged with activated oxygen gas.

17 Claims, 18 Drawing Sheets

(51) Int. Cl.
*C23C 16/46* (2006.01)
*H01L 21/687* (2006.01)
*C23C 16/44* (2006.01)
*C23C 16/50* (2006.01)
*C23C 16/34* (2006.01)
*C23C 16/40* (2006.01)
*C23C 16/455* (2006.01)

(52) U.S. Cl.
CPC .... *C23C 16/4408* (2013.01); *C23C 16/45565* (2013.01); *C23C 16/46* (2013.01); *C23C 16/50* (2013.01); *H01L 21/0217* (2013.01); *H01L 21/0228* (2013.01); *H01L 21/02164* (2013.01); *H01L 21/02178* (2013.01); *H01L 21/02186* (2013.01); *H01L 21/02205* (2013.01); *H01L 21/02211* (2013.01); *H01L 21/68764* (2013.01); *H01L 21/68771* (2013.01)

(58) Field of Classification Search
CPC ......... H01L 21/02211; H01L 21/02274; H01L 21/0228; H01L 21/68764; H01L 21/68771; C23C 16/401; C23C 16/4408; C23C 16/45565; C23C 16/46; C23C 16/50
USPC ....................................................... 438/763
See application file for complete search history.

(56) References Cited

U.S. PATENT DOCUMENTS

| | | | |
|---|---|---|---|
| 8,900,963 B2 | 12/2014 | Sills et al. | |
| 8,956,984 B2 | 2/2015 | Okuda | |
| 9,177,786 B2 | 11/2015 | Sano et al. | |
| 10,026,606 B2 | 7/2018 | Kato et al. | |
| 10,312,078 B2 | 6/2019 | Murakami et al. | |
| 2006/0199399 A1 | 9/2006 | Muscat | |
| 2007/0269982 A1 | 11/2007 | Rocklein et al. | |
| 2008/0242097 A1 | 10/2008 | Boescke et al. | |
| 2011/0159187 A1 | 6/2011 | Kato et al. | |
| 2012/0052693 A1 | 3/2012 | Ozaki et al. | |
| 2013/0171822 A1 | 7/2013 | Chandrashekar et al. | |
| 2014/0051263 A1 | 2/2014 | Tanaka et al. | |
| 2014/0199854 A1 | 7/2014 | Chen et al. | |
| 2014/0209562 A1 | 7/2014 | La Voie et al. | |
| 2014/0213037 A1 | 7/2014 | LiCausi et al. | |
| 2015/0099374 A1 | 4/2015 | Kakimoto et al. | |
| 2015/0217330 A1 | 8/2015 | Haukka et al. | |
| 2016/0013042 A1 | 1/2016 | Hashimoto et al. | |
| 2017/0125238 A1 | 5/2017 | Hasebe et al. | |
| 2017/0140920 A1 | 5/2017 | Amepalli et al. | |
| 2017/0140931 A1 | 5/2017 | Van Cleemput et al. | |
| 2018/0019114 A1* | 1/2018 | Kato | C23C 16/45542 |
| 2018/0237912 A1* | 8/2018 | Takahashi | H01J 37/32752 |
| 2019/0051511 A1 | 2/2019 | Kato et al. | |
| 2019/0051512 A1 | 2/2019 | Kato et al. | |
| 2019/0287787 A1 | 9/2019 | Nishino et al. | |

FOREIGN PATENT DOCUMENTS

| | | |
|---|---|---|
| JP | 2012-138501 | 7/2012 |
| JP | 2013-135154 | 7/2013 |
| JP | 2017-092098 | 5/2017 |
| JP | 2017-112258 | 6/2017 |
| JP | 2017-139306 | 8/2017 |
| KR | 10-2015-0101431 | 9/2015 |
| KR | 10-2017-0000351 | 1/2017 |
| WO | 2004/079813 | 9/2004 |

* cited by examiner

FIG.17

|  | V-SiN | O* TREATMENT |
|---|---|---|
| ROTATION [rpm] | 20 | – |
| TEMP. [deg.C] | 350 | 350 |
| PRESS. [Torr] | 2.0 | 2.0 |
| Cl$_2$ [sccm] | 5 | – |
| O$_2$ [sccm] | – | 300 |
| REMOTE-Ar [sccm] | 4000 | 4000 |
| NH$_3$ [sccm] | 2000 | – |
| DCS [sccm] | 1000 | – |
| TIME [sec] | 3600 | 600 |

FILM DEPOSITION METHOD

CROSS-REFERENCE TO RELATED APPLICATION

The present application is based on and claims priority to Japanese Priority Application No. 2019-014764 filed on Jan. 30, 2019, the entire contents of which are hereby incorporated herein by reference.

BACKGROUND OF THE INVENTION

1. Field of the Invention

The present disclosure relates to a film deposition method.

2. Description of the Related Art

Japanese Patent Application Publication No. 2013-135154 discloses a film deposition method that adsorbs a hydroxyl group on the inner surface of a depression formed in a substrate with a desired distribution, supplies an organic aminosilane gas to the substrate on which the hydroxyl group is adsorbed, and then supplies an oxidation gas to the substrate on which the organic aminosilane gas is adsorbed, thereby depositing a silicon oxide film in the depression.

According to the film deposition method, by controlling the adsorption distribution of the hydroxyl group, the film deposition can be performed with a desired film thickness distribution, and the film deposition with a high bottom-up property or conformal to the shape of the concave part can be performed according to the intended use.

Meanwhile, the above-described bottom-up deposition method is required for film deposition other than film deposition of a silicon oxide film, for example, film deposition of a nitride film, to satisfy the high density and diversification of semiconductor integrated circuits, and a film deposition method that achieves the substantially uniform and reproducible film thickness when repeatedly depositing the nitride film, is demanded.

SUMMARY OF THE INVENTION

According to an embodiment, a film deposition method is provided. In the method, chlorine gas is activated in a plasma generator, and an adsorption inhibitor group is formed by adsorbing the activated chlorine gas on a surface of a substrate in a processing chamber. A source gas containing chlorine and one of silicon and a metal is adsorbed on a region without the adsorption inhibitor group of the surface of the substrate, and a nitride film is deposited by supplying a nitriding gas to the surface of the substrate and causing the nitriding gas to react with the source gas. The substrate on which the nitride film is deposited is carried out of the processing chamber, and an inside of the plasma generator is purged with activated oxygen gas.

Additional objects and advantages of the embodiments are set forth in part in the description which follows, and in part will become obvious from the description, or may be learned by practice of the disclosure. The objects and advantages of the disclosure will be realized and attained by means of the elements and combinations particularly pointed out in the appended claims. It is to be understood that both the foregoing general description and the following detailed description are exemplary and explanatory and are not restrictive of the disclosure as claimed.

BRIEF DESCRIPTION OF THE DRAWINGS

FIG. 17 is a table for explaining working conditions of an embodiment in which a film deposition method according to the present embodiment is performed.

DETAILED DESCRIPTION OF THE PREFERRED EMBODIMENTS

Hereinafter, embodiments of the present disclosure will be described in detail with reference to the drawings.

[Film Deposition Apparatus]

Figure 1:
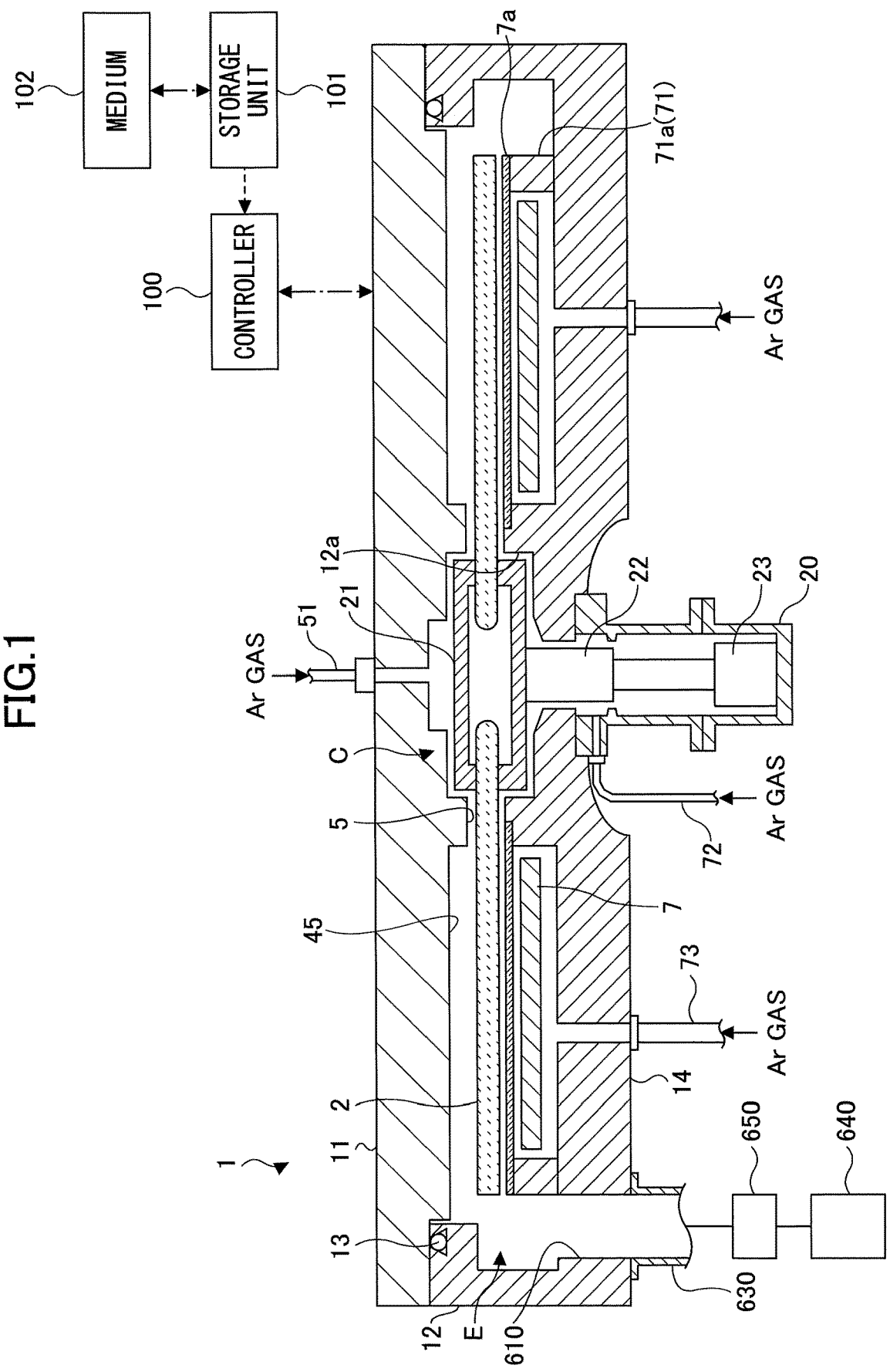
FIG. 1 is a schematic cross-sectional view illustrating a film deposition apparatus used in the present embodiment.
Figure 2:
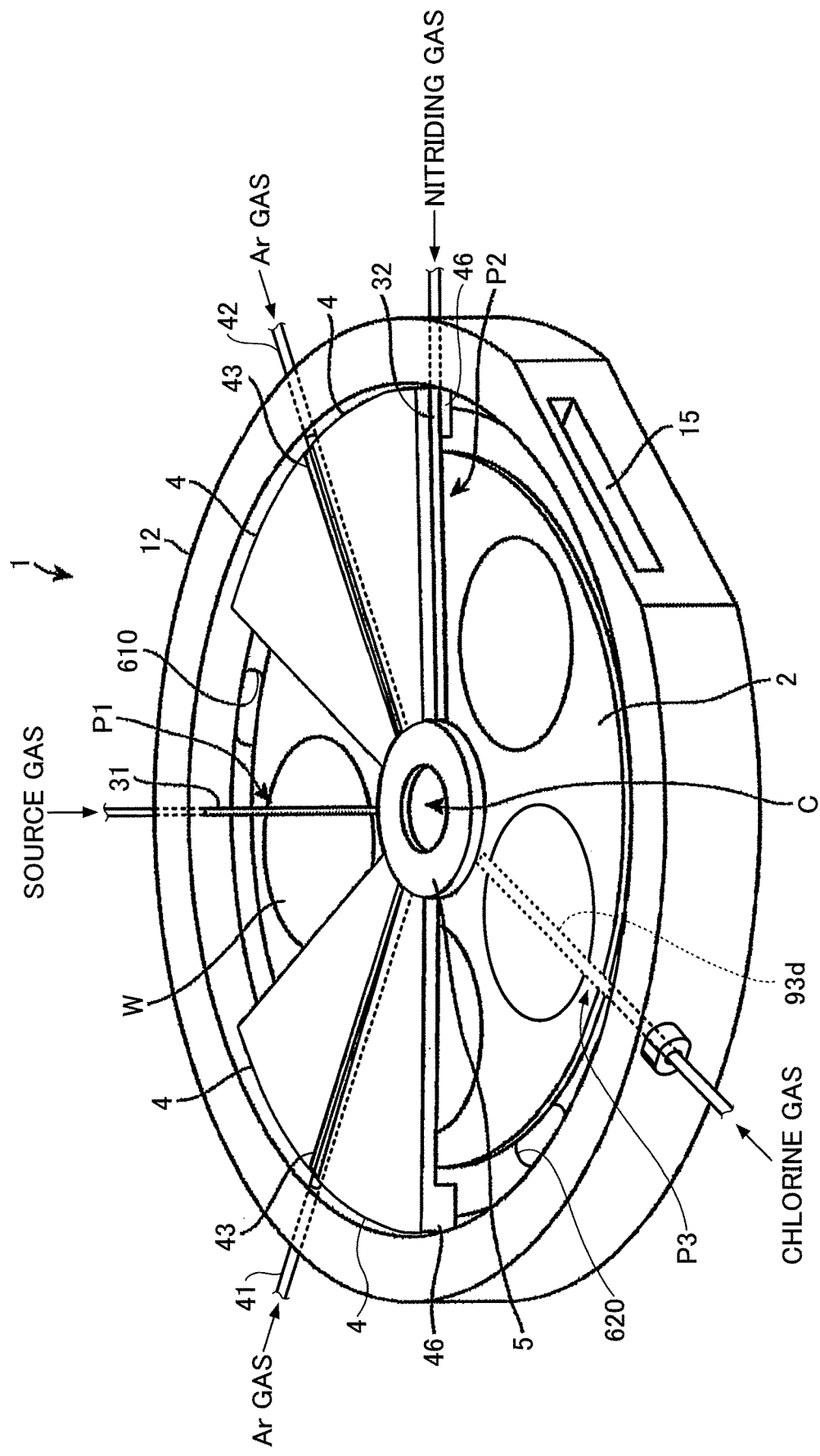
FIG. 2 is a schematic perspective view illustrating a configuration in a vacuum chamber of a film deposition apparatus used in the present embodiment.
Figure 3:
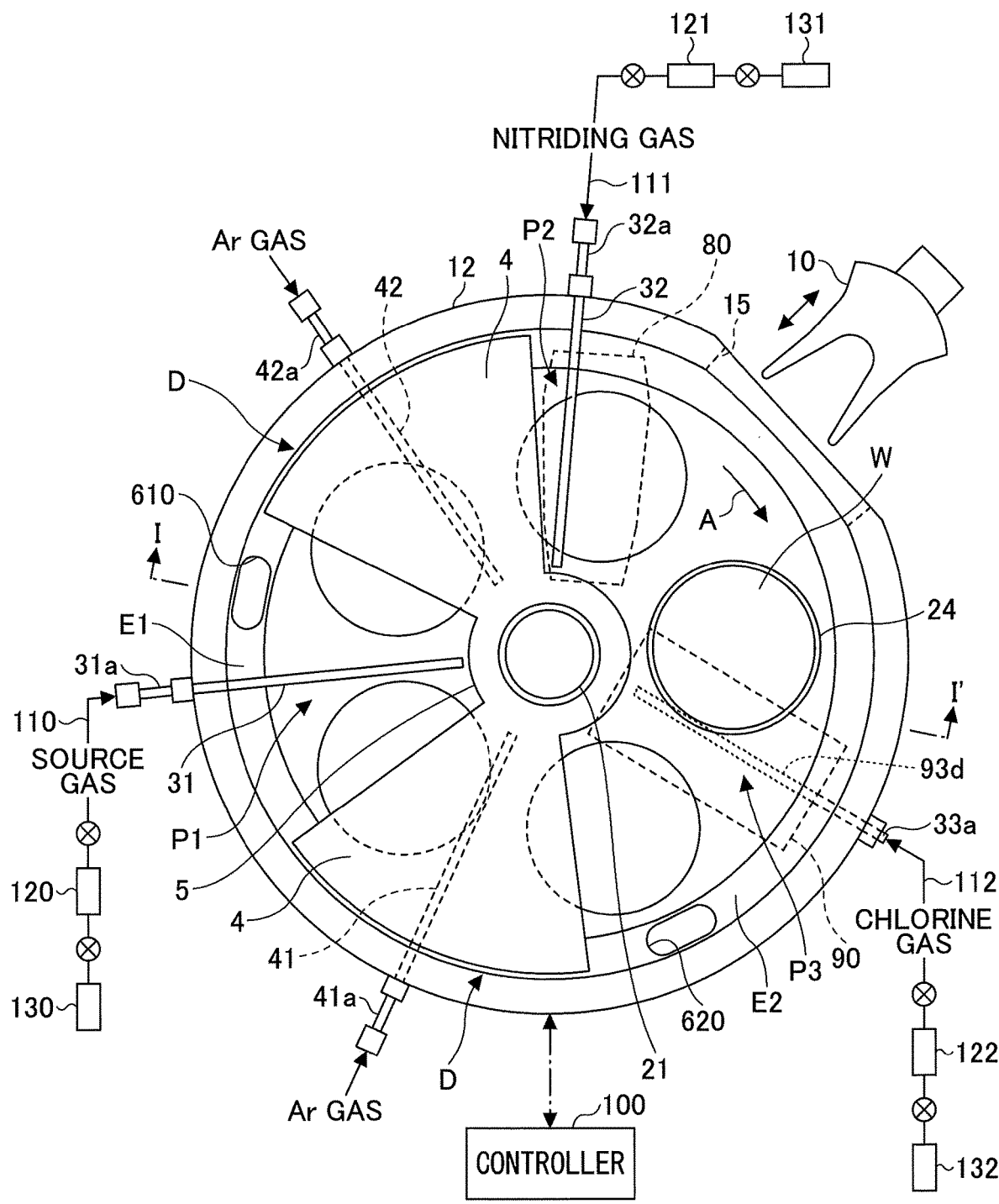
FIG. 3 is a schematic plan view illustrating a configuration in a vacuum container of the deposition device used in the present embodiment.

A film deposition apparatus used in a film deposition method according to an embodiment will be described. As illustrated in FIGS. 1 to 3, a deposition apparatus used in a film deposition method according to the present embodiment includes a flat vacuum chamber 1 having a substantially circular shape in plan view, and a turntable 2 disposed in the vacuum chamber 1 having a center of rotation at the center of the vacuum chamber 1. The vacuum chamber 1 is a processing chamber in which a film deposition process is performed on a surface of a wafer enclosed therein. The vacuum chamber 1 has a chamber body 12 having a cylindrical shape with a bottom and a top plate 11 that is hermetically disposed on the top surface of the chamber body 12 via a sealing member 13 (FIG. 1), such as an O-ring.

The turntable 2 is fixed to a cylindrical core portion 21 at the center, and the core portion 21 is fixed to the upper end of a vertically extending rotary shaft 22. A rotary shaft 22 passes through a bottom portion 14 of the vacuum chamber 1 and is attached to a drive unit 23 having a lower end that rotates the rotary shaft 22 (FIG. 1) about a vertical axis. The rotary shaft 22 and the drive unit 23 are housed in a cylindrical case 20 having an open top surface. The flange portion on the upper surface of the case body 20 is hermetically mounted on the lower surface of the bottom portion 14 of the vacuum chamber 1, and the internal and external atmospheres of the case body 20 are maintained in an airtight condition.

On the surface of the turntable 2, as illustrated in FIGS. 2 and 3, a circular recess 24 is disposed for mounting a semiconductor wafer (hereinafter, referred to as a "wafer") W, such as a silicon substrate, which is a plurality of substrates (five in the illustrated example) along the rotation direction (the circumferential direction). For convenience, the wafer W is illustrated in FIG. 3 only in one recess 24. The recess 24 has an inner diameter of, for example, 4 mm greater than the diameter of the wafer W and a depth approximately equal to the thickness of the wafer W. Therefore, when the wafer W is housed in the recess 24, the surface of the wafer W and the surface of the turntable 2 (the area in which the wafer W is not placed) become the same height. A through hole (not illustrated) is formed in the bottom surface of the recess 24 through which, for example, three raising and lowering pins penetrate to support the back surface of the wafer W and raise and lower the wafer W.

FIGS. 2 and 3 are diagrams illustrating a structure inside the vacuum chamber 1, in which the top plate 11 is not illustrated for the sake of illustration. As illustrated in FIGS. 2 and 3, above the turntable 2, a reaction gas nozzle 31 made of quartz, a reaction gas nozzle 32, a gas discharge part 93$d$ of a remote plasma generator 90, which will be described later, and separation gas nozzles 41 and 42 are arranged in a circumferential direction of the vacuum chamber 1 (the rotation direction of the turntable 2 (arrow A in FIG. 3)), respectively, spaced apart from each other. In the illustrated example, the gas discharge part 93$d$ of the remote plasma generator 90, the separation gas nozzle 41, the reaction gas nozzle 31, the separation gas nozzle 42, and the reaction gas nozzle 32 are arranged in this order clockwise from the transfer port 15 (rotation direction of the turntable 2) described below. These nozzles 31, 32, 41, and 42 are introduced into the vacuum chamber 1 from the outer peripheral wall of the vacuum chamber 1 by securing the gas inlet ports 31$a$, 32$a$, 41$a$, and 42$a$ (FIG. 3), which are the proximal ends of the respective nozzles 31, 32, 41, and 42, to the outer peripheral wall of the chamber body 12, and are mounted so as to extend horizontally along the radial direction of the chamber body 12 with respect to the turntable 2. The gas supply line 92 of the remote plasma generator 90 connected to the gas discharge part 93$d$ described below may be connected to the gas inlet port 33$a$.

In the present embodiment, as illustrated in FIG. 3, the reaction gas nozzle 31 is connected to a source 130 of a source gas via a pipe 110, a flow controller 120 and the like. The reaction gas nozzle 32 is connected to a source 131 of a nitriding gas via a pipe 111, a flow controller 121 and the like. In addition, a gas supply line 92 of the remote plasma generator 90 is connected to a source 132 of chlorine ($Cl_2$) gas via a pipe 112, a flow controller 122 and the like. The separation gas nozzles 41 and 42 are connected to a source (not illustrated) of a separation gas, such as through pipes and flow control valves (not illustrated). As the separation gas, a noble gas such as helium (He) and argon (Ar), or an inert gas such as nitrogen ($N_2$) gas may be used. In the present embodiment, an example of using Ar gas will be described.

Figure 4:
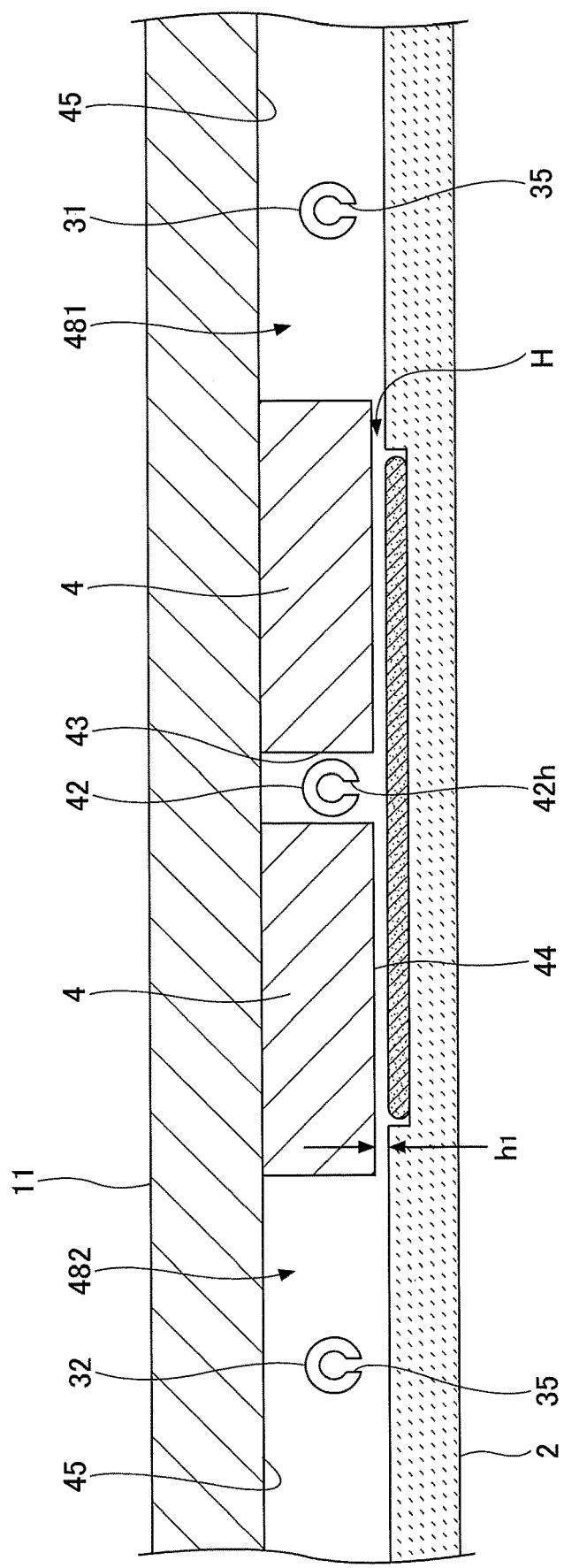
FIG. 4 is a schematic cross-sectional view illustrating a vacuum chamber along a concentric circle of a turntable of a deposition apparatus used in the present embodiment.

As illustrated in FIG. 4, a plurality of discharge holes 35 opening toward the turntable 2 is arranged in the reaction gas nozzles 31, 32, for example, at 10 mm intervals along the lengthwise direction of the reaction gas nozzles 31, 32. As illustrated in FIGS. 2 and 3, a region under the reaction gas nozzle 31 is a first processing region P1 for adsorbing a source gas to the wafer W. A region under the reaction gas nozzle 32 forms a second processing region P2 to supply a nitriding gas to nitride the source gas adsorbed on the wafer W in the first processing region P1 and to produces a nitride film. A region under the gas discharge part 93$d$ of the remote plasma generator 90 forms a third processing region P3 to supply plasma-activated chlorine gas to the reaction product (nitride film) generated in the second processing region P2 and to form an adsorption inhibitor group. In the present application, because the first processing region P1 is a region to adsorb the source gas on the wafer, the first processing region P1 may be referred to as a source gas adsorption region P1. Similarly, because the second processing region P2 is a region to nitride the source gas by supplying a nitriding gas capable of reacting with the source gas to produce a nitride, the second processing region P2 may be referred to as a nitriding region P2. In addition, because the third processing region P3 is a region to adsorb activated chlorine gas, such as a chlorine radical, on a surface of the wafer W, the third processing region P3 may be referred to as an activated chlorine adsorption region P3.

A plasma generator 80 is provided above the second processing region P2 and the remote plasma generator 90 is provided above the third processing region P3. In FIG. 3, the plasma generator 80 and the remote plasma generator 90 are illustrated while being simplified by dashed lines. Details of the plasma generator 80 and the remote plasma generator 90 are described below.

As the source gas, a gas containing silicon and chlorine or a gas containing a metal and chlorine is selected. For example, when a silicon nitride (SiN) film is deposited, a gas containing silicon and chlorine such as dichlorosilane (DCS, $SiH_2Cl_2$) is selected. In addition, when a metal nitride film such as a titanium nitride film and an aluminum nitride film (AlN film) is deposited, for example, a gas containing a metal and chlorine such as titanium tetrachloride ($TiCl_4$) or aluminum trichloride ($AlCl_3$) is selected as the source gas.

As the nitriding gas, generally, an ammonia ($NH_3$)-containing gas is selected. In addition, nitrogen ($N_2$)-containing gas may be selected when a nitriding gas is supplied by being activated by plasma. The nitriding gas may contain a carrier gas such as Ar in addition to ammonia.

The chlorine gas supplied from the third reaction gas nozzle has a role of forming an adsorption inhibitor group on the surface of the wafer that prevents the source gas supplied from the first reaction gas nozzle 31 from adsorbing on the wafer. For example, when a depression pattern, such as a via or a trench, is formed in the surface of the wafer, by forming an adsorption inhibitor group on the top surface and the upper portion of the depression pattern of the wafer, the thickness of the film is not thickened at the upper portion of the depression pattern, and the film on the bottom side is thickened. This makes it possible to form a film with high bottom-up properties. By nitriding the source gas, the source gas terminates with a hydrogen group of a NH$_2$ structure, while forming an adsorption site for the source gas. When activated chlorine is supplied, the H group in the NH$_2$ structure is replaced by a Cl group. As described above, because the source gas contains chlorine and chlorine molecules do not adsorb to each other, the source gas does not adsorb to the portion terminated with chlorine. Thus, the location terminated with a Cl group serves as an adsorption inhibitor group and inhibits the adsorption of the source gas. The activated chlorine gas easily reaches and adsorbs on the top surface and the upper portion of the depression pattern of the wafer W. However, because the activated chlorine gas is unlikely to reach the bottom and the lower portion of the depression pattern, the density of the Cl group decreases toward the bottom. Accordingly, the adsorption inhibitor group is formed at a high density on the upper portion of the depression pattern and on the top surface of the wafer, while the adsorption inhibitor group is formed at a low density on the lower portion (bottom) of the depression pattern. As a result, the source gas can be absorbed more to the lower portion pf the depression pattern than the top surface and the upper portion of the depression pattern of the wafer W, and bottom-up film deposition in which the film deposition starts at the bottom of the depression pattern is possible. The gas supplied from the third reaction gas nozzle may include a carrier gas such as Ar in addition to chlorine gas.

Referring to FIGS. 2 and 3, two convex portions 4 are provided in the vacuum chamber 1. The convex portions 4 form separation regions D together with the separation gas nozzles 41 and 42 and are attached to the back surface of the top plate 11 so as to protrude toward the turntable 2 as will be described later. Each of the convex portions 4 has a fan-like shape in plan view in which the top portion is cut in an arc-like manner. In the present embodiment, an inner arc is connected to the protrusion 5 (described later), and an outer arc is disposed along the inner peripheral surface of the chamber body 12 of the vacuum chamber 1.

FIG. 4 illustrates a cross section of the vacuum chamber 1 along the concentric circle of the turntable 2 from the reaction gas nozzle 31 to the reaction gas nozzle 32. As illustrated, because the convex portion 4 is mounted on the back surface of the top plate 11, there is a flat, lower ceiling surface 44 (a first ceiling surface) that is the lower surface of the convex portion 4 and a ceiling surface 45 (a second ceiling surface) that is higher than the ceiling surface 44 and that is positioned on both sides of the ceiling surface 44 in the circumferential direction. The ceiling surface 44 has a fan-like shape in plan view whose top is cut in an arc-like shape. As illustrated, the convex portion 4 has a radially extending groove 43 in the middle of the circumferential direction, and the separation gas nozzle 42 is housed within the groove 43. A groove 43 is also formed in the other convex portion 4, where the separating gas nozzle 41 is housed. The reactive gas nozzles 31 and 32 are also provided in the space under the high ceiling surface 45. These reactive gas nozzles 31, 32 are provided in the vicinity of the wafer W spaced apart from the ceiling surface 45. As illustrated in FIG. 4, the reaction gas nozzle 31 is provided in the space 481 on the right side below the high ceiling surface 45, and the reaction gas nozzle 32 is provided in the space 482 on the left side below the high ceiling surface 45.

A plurality of gas discharge holes 42h (see FIG. 4) that open toward the turntable 2 is arranged in the separation gas nozzles 41 and 42 that are housed in the grooves 43 of the convex part 4 at a distance of, for example, 10 mm along the lengthwise direction of the separation gas nozzles 41 and 42.

The ceiling surface 44 forms a separation space H that is a narrow space with respect to the turntable 2. When Ar gas is supplied from a plurality of gas discharge holes 42h in the separation gas nozzle 42, the Ar gas flows through the separation space H toward the spaces 481 and 482. On this occasion, because the volume of the separation space H is smaller than the volumes of the spaces 481 and 482, the pressure of the separation space H can be increased by the Ar gas compared to the pressures of the spaces 481 and 482. That is, a high pressure separation space H is formed between the spaces 481 and 482. Also, the Ar gas flowing out of the separation space H into the spaces 481 and 482 acts as a counter flow for the first reaction gas from the first processing region P1 and the second reaction gas from the second processing region P2. Thus, the first reaction gas from the first processing region P1 and the second reaction gas from the second processing region P2 are separated by the separation space H. Accordingly, the first reaction gas and the second reaction gas are mixed in the vacuum chamber 1, and the reaction is suppressed.

The height h1 of the ceiling surface 44 relative to the upper surface of the turntable 2 is preferably set to a height suitable for increasing the pressure of the separating space H compared to the pressures of the spaces 481 and 482 while considering the pressure in the vacuum chamber 1 during film deposition, the rotating speed of the turntable 2, the supply amount of the separation gas (Ar gas) to be supplied, and the like.

Meanwhile, on the lower surface of the top plate 11, the protrusion 5 (FIGS. 2 and 3) that surrounds the outer circumference of the core part 21 that fixes the turntable 2 is provided. In the present embodiment, the protrusion 5 continues to a portion of the convex portion 4 on the rotation center side, and a lower surface of the convex portion 4 is formed at the same height as that of the ceiling surface 44.

Figure 5:
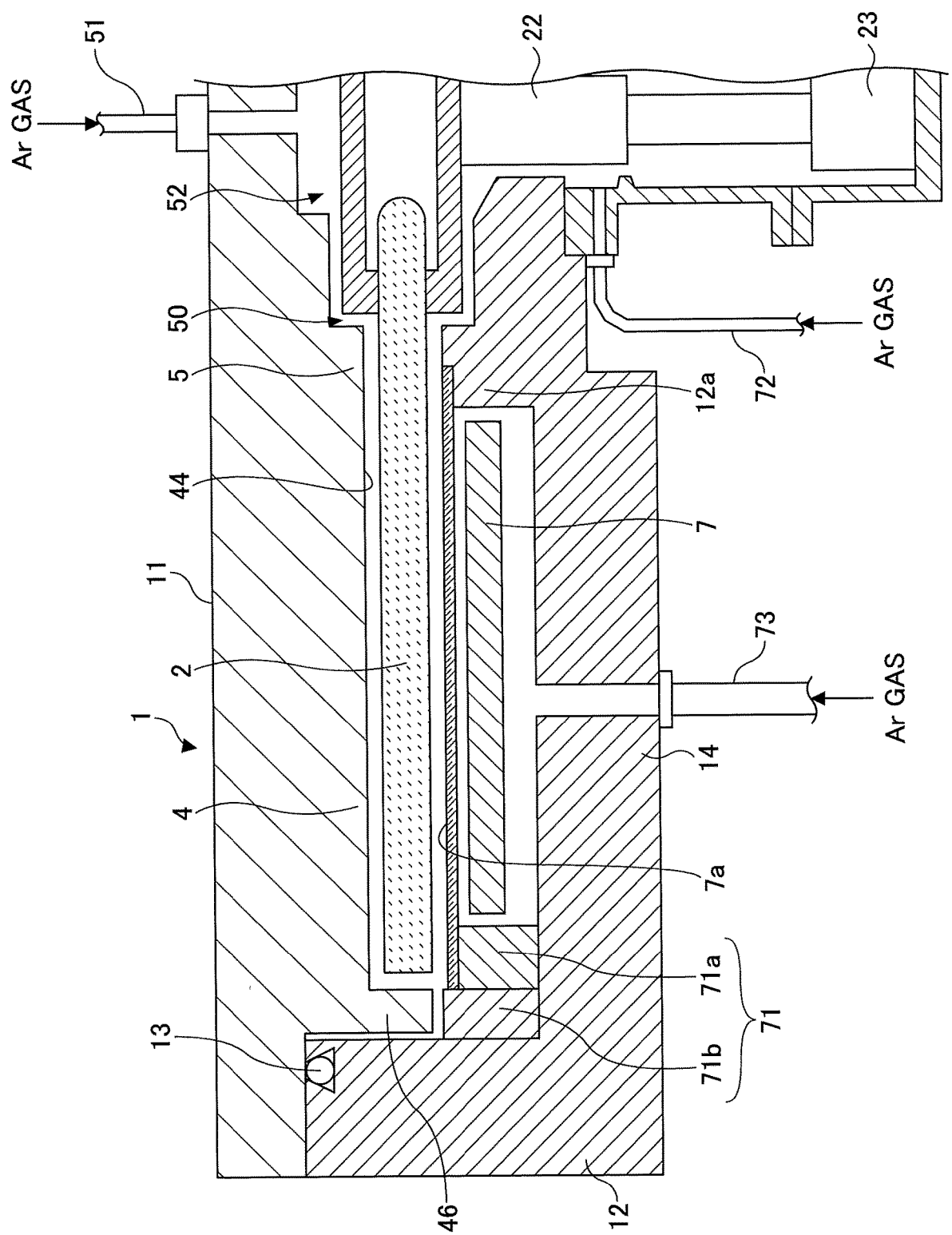
FIG. 5 is a schematic cross-sectional view illustrating a main part of a film deposition apparatus used in the present embodiment.

Referring to FIG. 1, a cross-sectional view along the I-I' line of FIG. 3 illustrates an area where the ceiling surface 45 is provided. Meanwhile, FIG. 5 is a cross-sectional view illustrating an area in which a ceiling surface 44 is provided. As illustrated in FIG. 5, a bent portion 46 that bends in an L-shape opposite to the outer end surface of the turntable 2 is formed at a peripheral portion (a portion on the outer edge of the vacuum chamber 1) of the fan-shaped convex portion 4. Similar to the convex portion 4, the bent portion 46 inhibits the reaction gas from flowing from both sides of the separation region D and inhibits the mixing of the reaction gas. Because the fan-shaped convex portion 4 is provided on the top plate 11 and the top plate 11 can be removed from the chamber body 12, there is a slight gap between the outer peripheral surface of the bent portion 46 and the chamber body 12. The clearance between the inner peripheral surface of the bent portion 46 and the outer end surface of the turntable 2 and the clearance between the outer peripheral surface of the bent portion 46 and the chamber body 12 is set to the same size as the height of the ceiling surface 44 with respect to the upper surface of the turntable 2, for example.

In the separation region D, the inner peripheral wall of the chamber body 12 is formed in a vertical plane in close proximity to the outer peripheral surface of the bent portion 46 as illustrated in FIG. 4. However, in a portion other than the separation region D, as illustrated in FIG. 1, the inner peripheral wall of the chamber body 12 is depressed outward from a portion facing the outer end surface of the turntable 2 to the bottom portion 14, for example. Hereinafter, for the sake of explanation, a depressed portion having a generally rectangular cross-sectional shape is referred to as an exhaust region. Specifically, the exhaust region communicating with the first processing region P1 is referred to as a first exhaust region E1, and the region communicating with the second and third processing regions P2 and P3 is referred to as a second exhaust region E2. At the bottom of these first and second exhaust regions E1 and E2, a first exhaust port 610 and a second exhaust port 620 are formed, respectively, as illustrated in FIGS. 1 to 3. The first exhaust port 610 and the second exhaust port 620 are each connected to a vacuum pump 640, for example, which is a vacuum evacuation unit through an exhaust line 630, as illustrated in FIG. 1. A pressure controller 650 is also provided between the vacuum pump 640 and the exhaust line 630. In FIG. 1, the first exhaust port 610 is illustrated, but the same applies to the second exhaust port 620.

As illustrated in FIGS. 2 and 3, the separation region H is not provided between the second and third processing regions P2 and P3, but in FIG. 3, a casing for partitioning the space above the turntable 2 is provided in the location illustrated as the plasma generator 80. Therefore, the space between the second processing region P2 and the third processing region P3 is partitioned.

The space between the turntable 2 and the bottom 14 of the vacuum chamber 1 includes a heater unit 7 that is a heating means as illustrated in FIGS. 1 and 5, and a wafer W on the turntable 2 is heated to a temperature (for example, 400 degrees C.) determined by a process recipe through the turntable 2. A ring-shaped cover member 71 is provided near the peripheral edge of the turntable 2 (FIG. 5) to partition the atmosphere from the upper space of the turntable 2 to the exhaust regions E1 and E2 and the atmosphere in which the heater unit 7 is placed so as to prevent a gas from entering a region below the turntable 2. The cover member 71 includes an inner member 71a disposed to face an outer edge and an outer peripheral side of the outer edge of the turntable 2 from a lower side of the turntable 2, and an outer member 71b disposed between the inner member 71a and an inner wall surface of the vacuum chamber 1. The outer member 71b is provided below the bent portion 46 formed in the outer edge of the convex portion 4 in the separation region D and is provided adjacent to the bent portion 46. The inner member 71a surrounds the heater unit 7 throughout under the outer edge of the turntable 2 (and slightly outside the outer edge).

The bottom portion 14 at a portion nearer the rotational center than the space in which the heater unit 7 is disposed protrudes upwardly toward the core portion 21 near the center of the lower surface of the turntable 2 and forms a protrusion 12a. The space between the projection 12a and the core portion 21 is narrow, and the space between the inner circumferential surface of the through hole for the rotary shaft 22 penetrating through the bottom portion 14 and the rotary shaft 22 is narrow. The narrow space communicates with the case body 20. The case 20 includes a purge gas supply line 72 for supplying Ar gas that serves as a purge gas into a narrow space. A plurality of purge gas supply lines 73 is provided at the bottom portion 14 of the vacuum chamber 1 to purge the space disposed in the heater unit 7 at predetermined angular intervals below the heater unit 7 (one purge gas supply line 73 is illustrated in FIG. 5). Between the heater unit 7 and the turntable 2, the lid member 7a covers the outer member 71b from the inner peripheral wall (the upper surface of the inner member 71a) to the upper end of the protrusion 12a in a circumferential direction in order to prevent a gas from entering the region where the heater unit 7 is provided. The lid member 7a may be made of, for example, quartz.

A separation gas supply line 51 is connected to the center of the top plate 11 of the vacuum chamber 1, and is configured to supply Ar gas, which is the separation gas, to the space 52 between the top plate 11 and the core portion 21. The separation gas supplied to the space 52 is discharged to the periphery along the surface of the wafer receiving region of the turntable 2 through the space 50 that is a narrow clearance between the protrusion part 5 and the turntable 2. The space 50 may be maintained at a pressure higher than the space 481 and the space 482 by the separation gas. Accordingly, the space 50 prevents the source gas supplied to the first processing region P1 and the nitriding gas supplied to the second processing region P2 from mixing through the central region C. That is, the space 50 (or center region C) can serve in the same way as the separate space H (or separate region D).

In addition, as illustrated in FIGS. 2 and 3, the side wall of the vacuum container 1 includes a transfer port 15 for transferring the wafer W, which is a substrate, between an external transfer arm 10 and the turntable 2. The transfer port 15 is opened and closed by a gate valve (not illustrated). Because the recess 24, which is a wafer receiving region in the turntable 2, receives a wafer W transferred from the transfer arm 10 at a position facing the transfer port 15, lifting pins for delivering the wafer onto the wafer receiving region 24 and a lifting mechanism (neither of which is illustrated) for lifting and lowering the wafer W by supporting the back surface via through holes provided in the recess 24 are provided at a position corresponding to the transfer position and on the lower side of the turntable 2.

Figure 6:
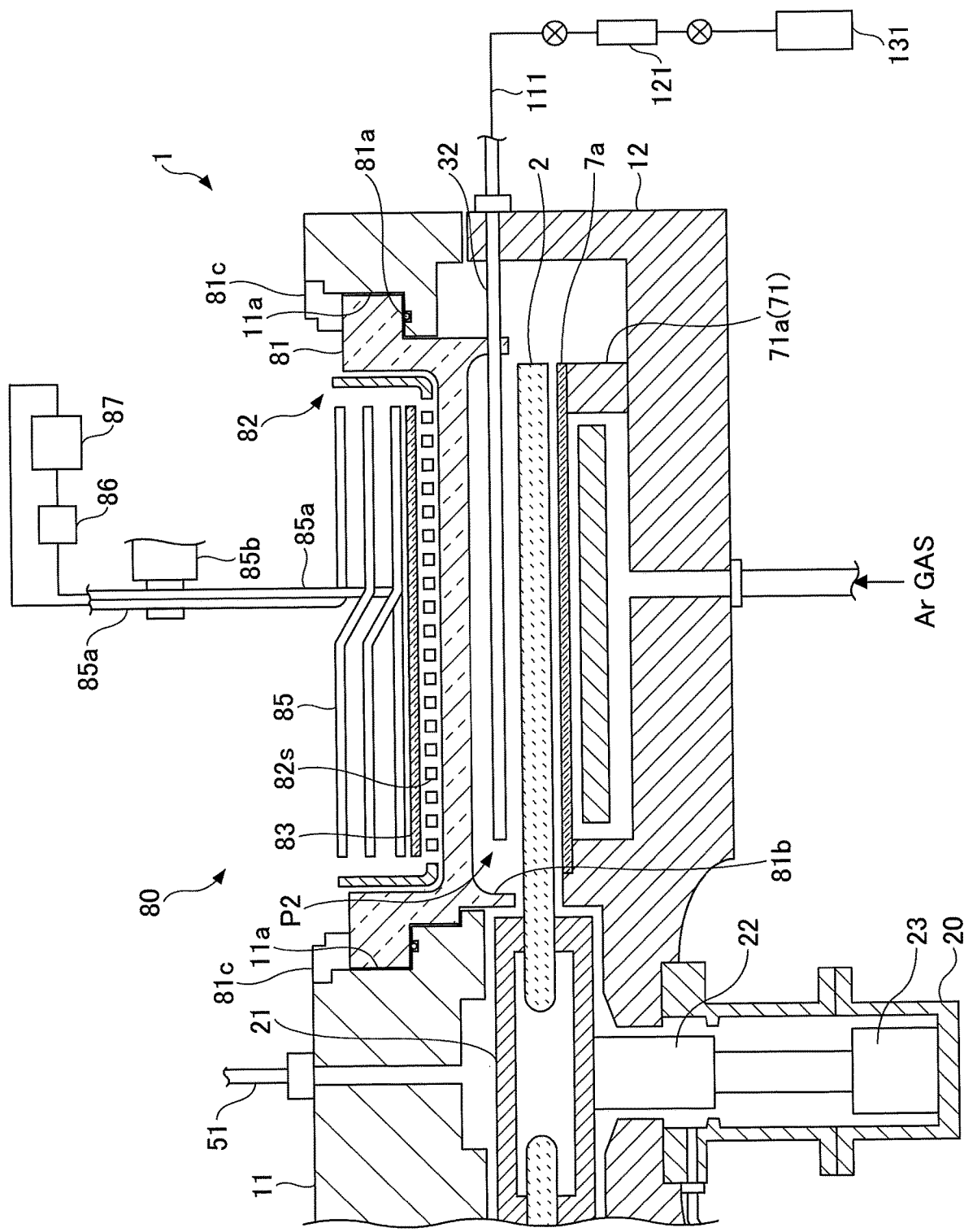
FIG. 6 is a schematic cross-sectional view illustrating a plasma generator of a film deposition apparatus used in the present embodiment.
Figure 7:
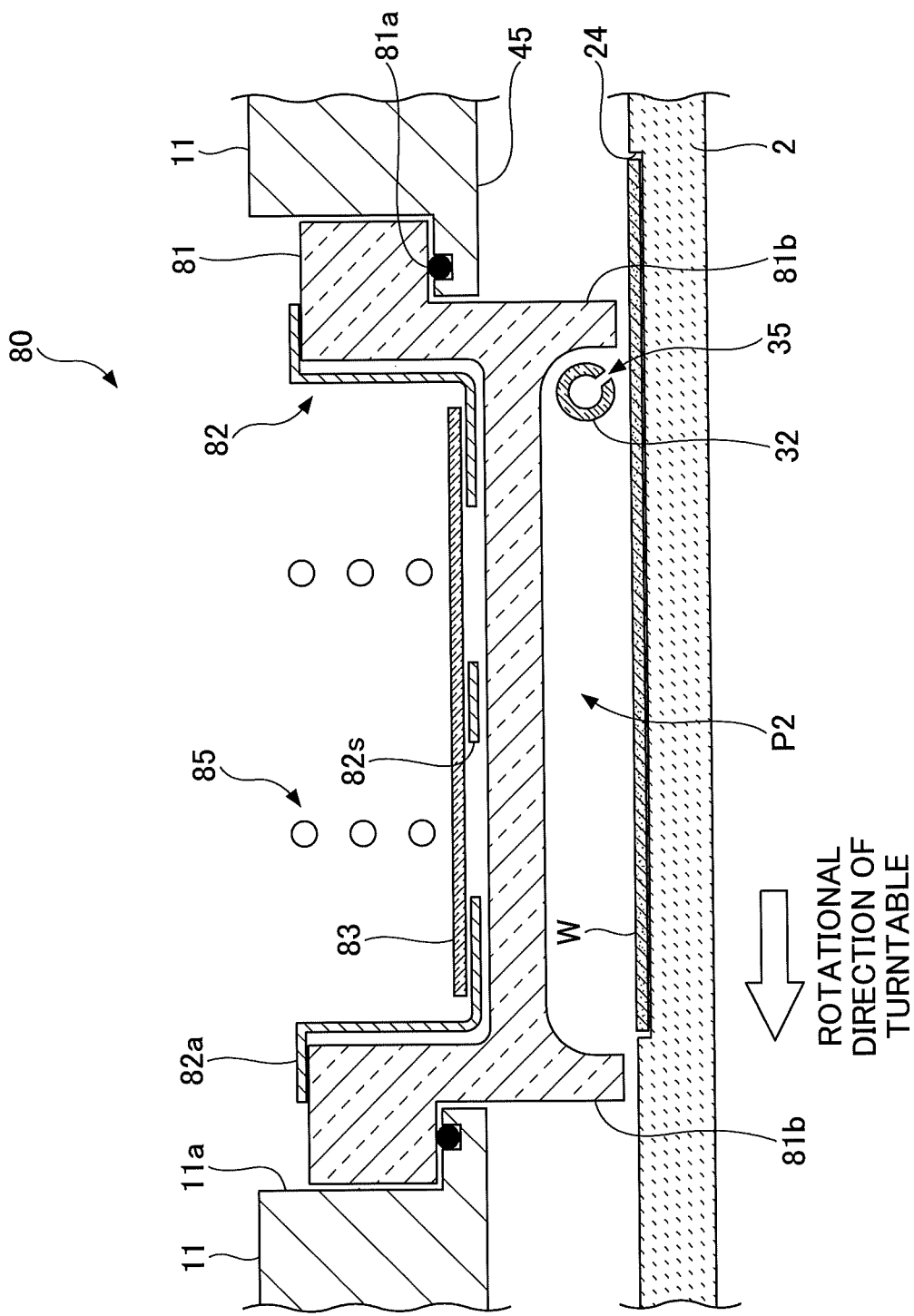
FIG. 7 is another schematic cross-sectional view of a plasma generator of a film deposition apparatus used in the present embodiment.
Figure 8:
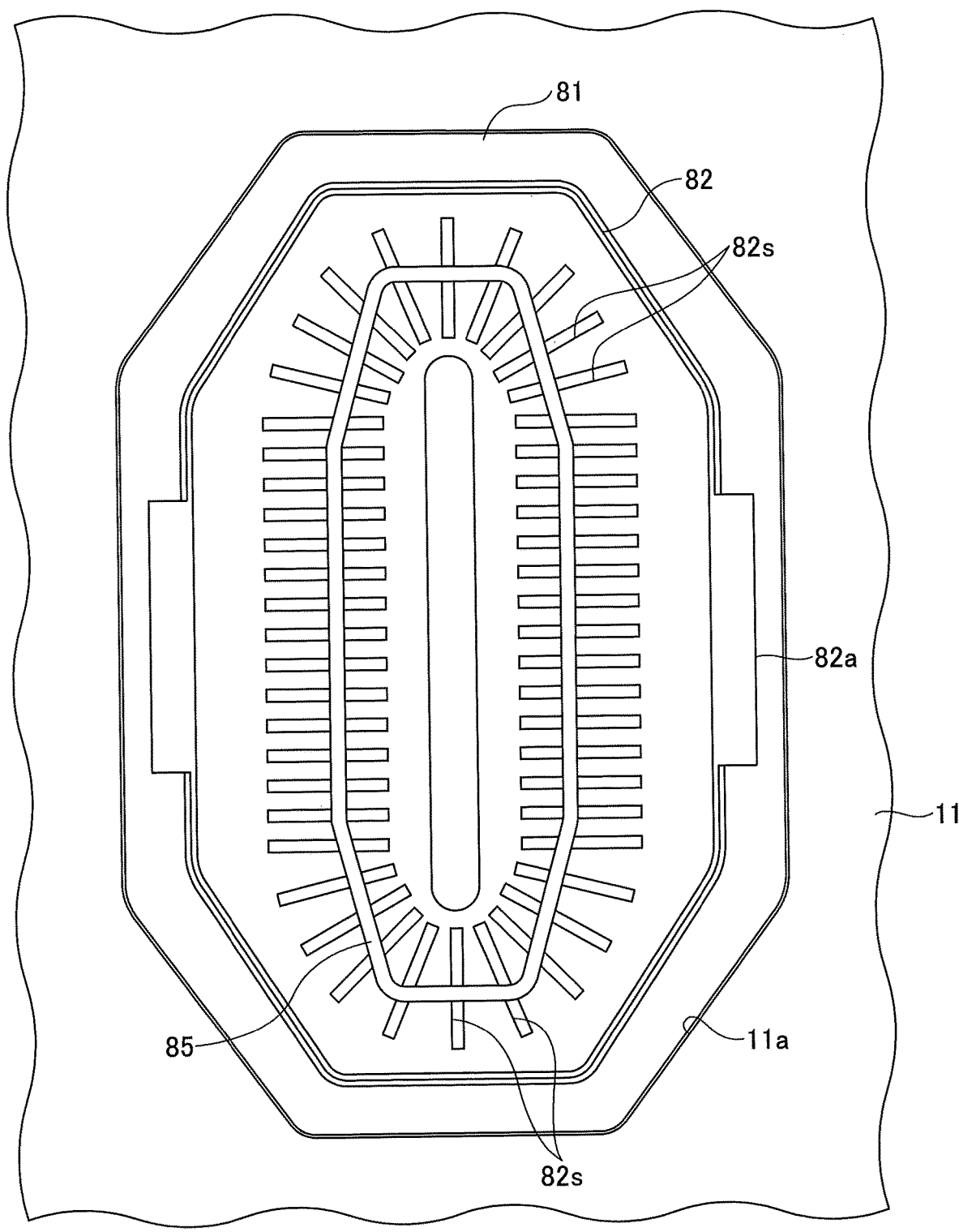
FIG. 8 is a schematic top view of a plasma generator of a film deposition apparatus used in the present embodiment.

Next, the plasma generator 80 will be described with reference to FIGS. 6 to 8. FIG. 6 is a schematic cross-sectional view of the plasma generator 80 along a radial direction of the turntable 2, FIG. 7 is a schematic cross-sectional view of the plasma generator 80 along a direction perpendicular to the radial direction of the turntable 2, and FIG. 8 is a schematic top view of the plasma generator 80. For convenience of illustration, some members are simplified in these diagrams.

Referring to FIG. 6, the plasma generator 80 includes a frame member 81 made of a high frequency transmissive material and having a recess recessed from the top surface and fitted into an opening 11a formed in the top plate 11, a Faraday shield plate 82 contained within the recesses of the frame member 81 and having a generally boxy shape with an opened upper portion, an insulating plate 83 disposed on the bottom surface of the Faraday shield plate 82, and a coiled antenna 85 supported on or above the insulating plate 83 and having a generally octagonal top shape.

An opening 11a of the top plate 11 has a plurality of steps, one of which has a groove formed throughout the entire circumference, and a sealing member 81a, such as an O-ring, is fitted into the groove. Meanwhile, the frame member 81 has a plurality of step portions corresponding to the step portions of the opening 11a. When the frame member 81 is fitted into the opening portion 11a, the back surface of the one of the steps is in contact with the seal member 81a fitted into the groove portion of the opening portion 11a. This maintains airtightness between the top plate 11 and the frame member 81. Further, as illustrated in FIG. 6, a pressing member 81c is provided along an outer circumference of the frame member 81 fitted into the opening 11a of the top plate 11, whereby the frame member 81 is pressed downward against the top plate 11. Thus, the airtightness between the top plate 11 and the frame member 81 is more reliably maintained.

The lower surface of the frame member 81 faces the turntable 2 in the vacuum chamber 1, and the outer circumference of the lower surface includes a protrusion portion 81b projecting downward (toward the rotation table 2) throughout the entire circumference. The lower surface of the protrusion portion 81b is close to the surface of the turntable 2, and a space (second processing region P2) is defined above the rotation table 2 by the protrusion portion 81b, the surface of the turntable 2, and the lower surface of the frame member 81. The distance between the lower surface of the protrusion portion 81b and the surface of the turntable 2 may be approximately the same as the height h1 of the ceiling surface 44 with respect to the upper surface of the turntable 2 in the separating space H (FIG. 4).

The second processing region P2 extends the reaction gas nozzle 32 penetrating through the protrusion portion 81b. In the present embodiment, a source 131 of a nitriding gas filled with the nitriding gas is connected to the reaction gas nozzle 32 through the pipe 111 via the flow controller 121, as illustrated in FIG. 6. The nitriding gas with a flow rate controlled by the flow controller 121 is activated by the plasma generator 80 and supplied to the second processing region P2 at a predetermined flow rate.

A plurality of discharge holes 35 is formed in the reaction gas nozzle 32 with predetermined intervals (for example, 10 mm) along the lengthwise direction of the reaction gas nozzle 32, and the nitriding gas is discharged from the discharge holes 35. As illustrated in FIG. 7, the discharge hole 35 is inclined from a direction perpendicular to the turntable 2 to a direction upstream of the turntable 2. For this reason, the gas supplied from the reaction gas nozzle 32 is discharged in the direction opposite to the rotation direction of the turntable 2, specifically toward the gap between the lower surface of the protrusion portion 81b and the surface of the turntable 2. This prevents the flow of the reaction gas or the separation gas from the space below the ceiling surface 45 located upstream of the plasma generator 80 along the direction of rotation of the turntable 2 into the second processing region P2. As described above, because the protrusion portion 81b formed along the outer circumference of the lower surface of the frame member 81 is close to the surface of the turntable 2, the pressure in the second processing region P2 can be easily maintained at a high level by the gas from the reaction gas nozzle 32. This also prevents the flow of the reaction gas or the separation gas into the second processing region P2.

As described above, the frame member 81 serves to separate the second processing region P2 from the third processing region P3. Accordingly, the film deposition apparatus used in the film deposition method according to the present embodiment does not necessarily include an entire plasma generator 80. However, it is assumed that the frame member 81 is provided in order to partition the second processing region P2 from the third processing region P3 and prevent mixing of reaction gases.

The Faraday shield plate 82 is made of a conductive material, such as metal, and is grounded, although not illustrated. As clearly illustrated in FIG. 8, a plurality of slits 82s is formed at the bottom of the Faraday shield plate 82. Each slit 82s extends substantially perpendicular to a corresponding edge of an antenna 85 having a generally octagonal shape in plan view.

The Faraday shield plate 82 also has outwardly bending supports 82a at the two top positions, as illustrated in FIGS. 7 and 8. The support 82a is supported on the top surface of the frame member 81 to support the Faraday shield plate 82 at a predetermined position within the frame member 81.

An insulating plate 83 is made, for example, of quartz glass and is slightly smaller than the bottom surface of the Faraday shield plate 82 and mounted to the bottom surface of Faraday shield plate 82. The insulating plate 83 isolates the Faraday shield plate 82 from the antenna 85 while transmitting high frequency waves radiated from the antenna 85 downwardly.

The antenna 85 is formed by winding a copper hollow tube (pipe), for example, in triples, such that the shape in plan view becomes generally octagonal. Cooling water can be circulated in the pipe to prevent the antenna 85 from being heated to a high temperature by high frequency waves supplied to the antenna 85. The antenna 85 includes a standing portion 85a, and a supporting portion 85b is attached to the standing portion 85a. The supporting portion 85b holds the antenna 85 at a predetermined position within the Faraday shield plate 82. A high frequency power source 87 is connected to the supporting portion 85b via a matching box 86. The high frequency power source 87 can generate high frequency power having a frequency of, for example, 13.56 MHz.

According to the plasma generator 80 having such a configuration, when the high frequency power is supplied to the antenna 85 from the high frequency power source 87 via the matching box 86, an electromagnetic field is generated by the antenna 85. The electric field component of this field is shielded by the Faraday shield plate 82 and thus cannot propagate downward. On the other hand, the magnetic field component propagates into the second processing region P2 through a plurality of slits 82s in the Faraday shield plate 82. The magnetic field component activates the nitriding gas supplied from the reaction gas nozzle 32 to the second processing region P2 at a predetermined flow rate ratio.

In the meantime, when chlorine gas is too strongly converted to plasma, an underlying film UF may be etched. The plasma generator 80 using the antenna 85 described in FIGS. 6 to 8 is an inductively coupled plasma generator (ICP, Inductively Coupled Plasma) and is useful for generating plasma with high plasma intensity. However, a plasma generator that generates weaker plasma is preferably used for chlorine activation. That is, the supply of chlorine gas is intended to cause the chlorine gas to adsorb at a high density on the upper portion of the depression pattern of the wafer W, and to generate the adsorption inhibitor group on the upper portion of the depression pattern, and is not intended to etch the film. Therefore, plasma formation of the chlorine gas is performed within a range where the etching action does not occur without increasing the plasma intensity. According to the plasma generated in this manner, chlorine gas can be adsorbed on the upper portion of the depression pattern such as a via or a trench formed in the surface of the wafer W to form an adsorption inhibitor group against the source gas, and to deposit a film from the bottom side where adsorption of the source gas is not inhibited by the adsorption inhibitor group. The remote plasma generator 90 is suitable for generating plasma weaker than that of the plasma generator 80. Accordingly, in the film deposition apparatus according to the present embodiment, activation of chlorine gas in the third processing region P3 is performed using the remote plasma generator 90.

Figure 9:
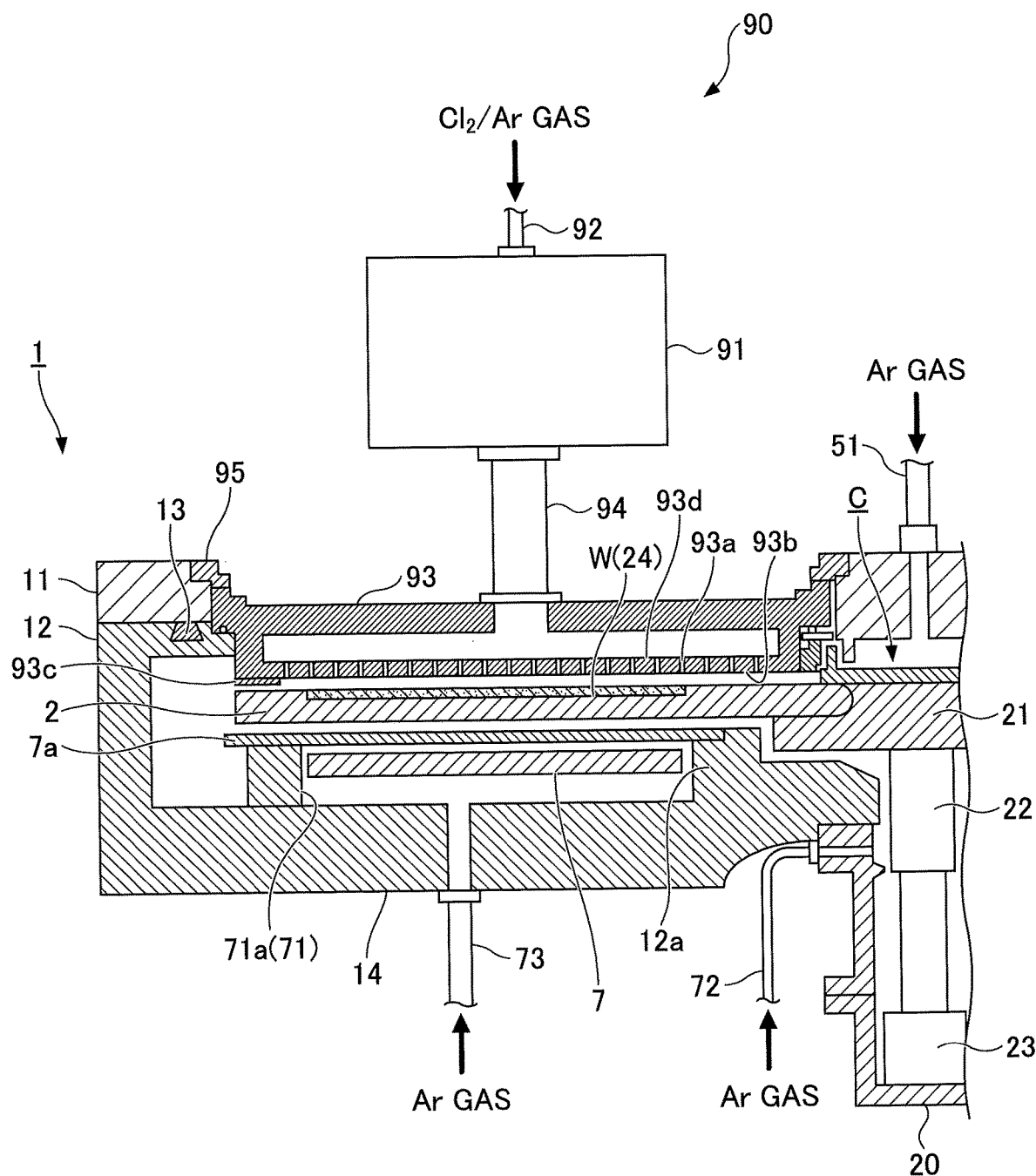
FIG. 9 is a schematic cross-sectional view illustrating a remote plasma generator of a film deposition apparatus used in the present embodiment.

FIG. 9 is a cross-sectional view of a portion of the film deposition apparatus including a remote plasma generator 90 according to the present embodiment.

As illustrated in FIG. 3, the remote plasma generator 90 is provided in the third processing region P3 and is opposite to the turntable 2, as illustrated in FIG. 9. The remote plasma generator 90 includes a plasma generation part 91, a gas supply line 92, a showerhead part 93, and a pipe 94. The showerhead part 93 is an example of a chlorine gas discharge portion, for example, a gas nozzle may be used instead of the showerhead part 93.

The plasma generation part 91 activates and radicalizes the chlorine gas supplied from the gas supply line 92 by a plasma source. The plasma source is not particularly limited if it is possible to activate the chlorine gas. For example, inductively coupled plasma (ICP), capacitively coupled plasma (CCP), and surface wave plasma (SWP) can be used as the plasma source.

The gas supply line 92 is connected at one end to the plasma generation part 91 to supply chlorine gas to the plasma generation part 91. The other end of the gas supply line 92 is connected to a chlorine gas source 132 in which the chlorine gas is stored, for example, via an open/close valve and a flow regulator.

The showerhead part 93 is connected to the plasma generation part 91 via the pipe 94 and is a portion for supplying chlorine gas activated by the plasma generation part 91 into the vacuum chamber 1. The showerhead part 93 has a fan-like shape in plan view and is circumferentially compressed downwardly by a pressing member 95 formed along the outer edge having a fan-like shape in plan view. Further, when the pressing member 95 is fixed to the top plate 11 by bolts or the like (not illustrated), the internal atmosphere of the vacuum chamber 1 is made airtight. The distance between the lower surface of the showerhead part 93 and the upper surface of the turntable 2 when being fixed to the top plate 11 can be, for example, about 0.5 mm to about 5 mm.

The showerhead part 93 has a plurality of gas discharge holes 93a so that the angular velocity of the turntable 2 is small at the rotation center side and is large at the outer circumference side corresponding to the difference in angular velocity. The number of the plurality of gas discharge holes 93a may be, for example, tens to hundreds. The diameter of the plurality of gas discharge holes 93a may be, for example, about 0.5 mm to about 3 mm. The activated chlorine gas supplied to the showerhead part 93 is supplied to the space between the turntable 2 and the showerhead part 93 through the gas discharge holes 93a.

The showerhead portion 93 may be made of a variety of materials, but may be made of a metal, for example. Specifically, for example, the showerhead part 93 may be made of aluminum. Aluminum is a metal commonly used in semiconductor manufacturing apparatuses, and the showerhead part 93 may be made of, for example, aluminum.

Figure 10:
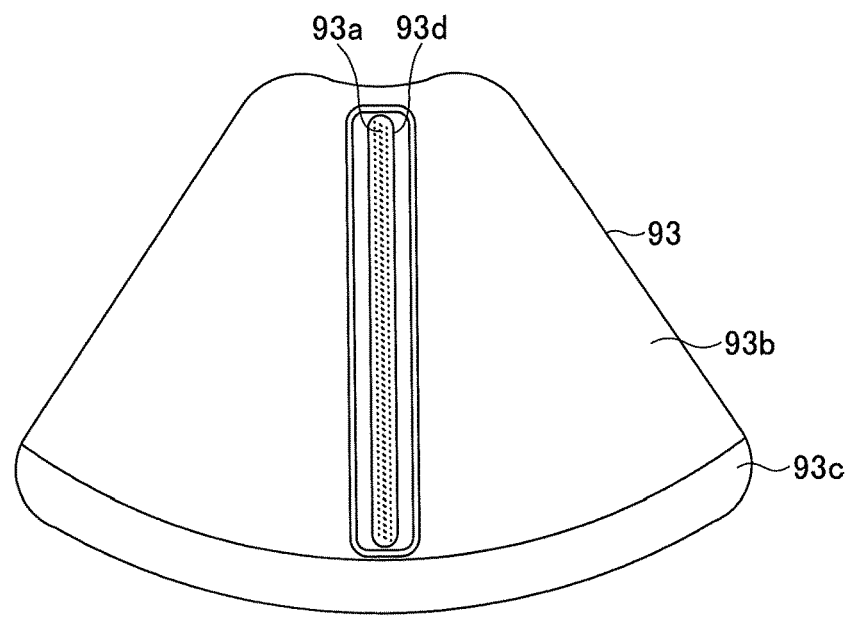
FIG. 10 is a top view of a showerhead portion of a remote plasma generator.

FIG. 10 is a plan view illustrating an example of a lower surface of the showerhead part 93. As illustrated in FIG. 10, a lower protruding surface 93c may be provided in a band along the outer periphery of a lower surface 93b of the fan-shaped showerhead portion 93. Therefore, a decrease in pressure of the outer peripheral side of the third processing region P3 can be prevented uniformly in the circumferential direction. However, the lower protruding surface 93c is not mandatory and may be provided as needed. Also, the gas discharge holes 93a may be provided while being arranged radially extending in the circumferential center of the lower surface 93b of the showerhead part 93. Therefore, chlorine gas can be supplied while being dispersed from the center side to the outer peripheral side of the rotating table 2. In the present application, the portion in which the plurality of gas discharge holes 93a is provided in the showerhead part 93 may be expressed as the gas discharge part 93d.

Thus, the remote plasma generator 90 is used to supply activated chlorine gas, for example, chlorine radicals, to the wafer W.

In the film deposition apparatus used in the film deposition method according to the present embodiment, as illustrated in FIG. 1, a controller 100 including a computer for controlling the operation of the entire apparatus is provided. A memory of the controller 100 stores a program for causing the film deposition apparatus to implement the film deposition method to be described later under the control of the controller 100. In this program, a group of steps is configured to execute the film deposition method described below. The program is stored in a medium 102, such as a hard disk, a compact disc, a magneto-optical disk, a memory card, and a flexible disk. The program is read into a storage unit 101 by a predetermined reading device and is installed in the controller 100.

Example of Film Deposition Method

Figure 11:
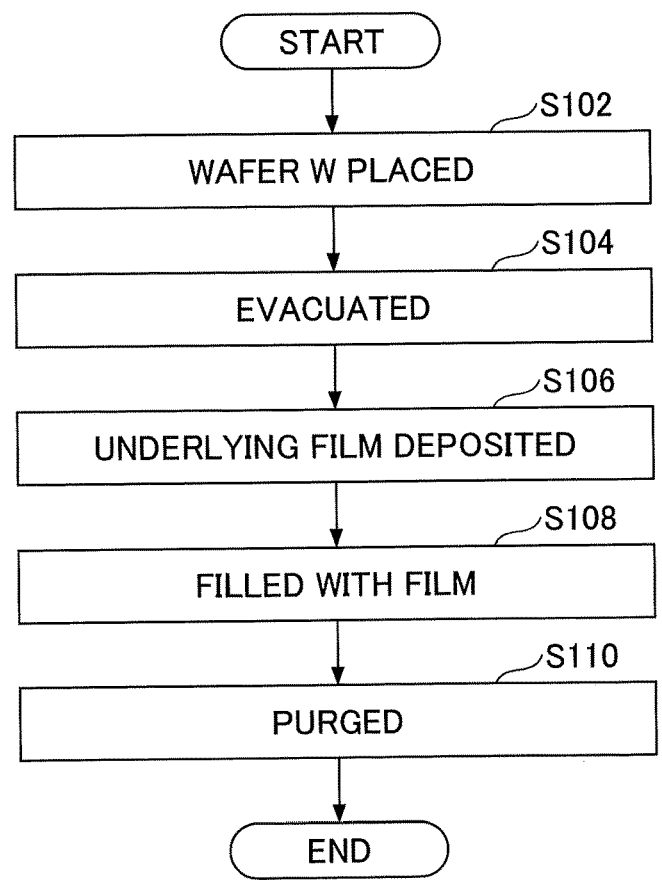
FIG. 11 is a flowchart illustrating an example of a film deposition method using a film deposition apparatus.
Figure 12A:
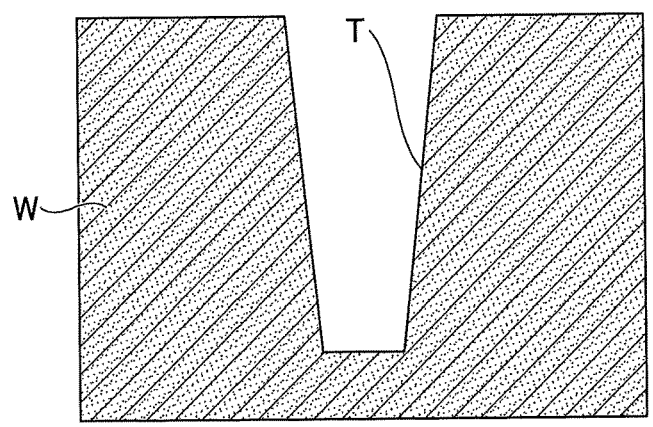
FIGS. 12A to 12E is a process diagrams of a method of depositing a SiN film.

Next, an example of a method of depositing a SiN film using the above-described film deposition apparatus will be described with reference to FIGS. 11 and 12A to 12E. FIG. 11 is a flowchart illustrating an example of a process of the method of depositing the SiN film, and FIGS. 12A to 12E schematically illustrate a cross-sectional view of the wafer W in the film deposition process. In the description of the method of forming the SiN film, a silicon wafer is used as the wafer W, and a trench T is formed in a surface of the silicon wafer as illustrated in FIG. 12A.

A case in which a SiN film is deposited using the above-described film deposition apparatus will be described. In this case, dichlorosilane (DCS, $SiH_2Cl_2$) is supplied from the reaction gas nozzle 31; ammonia ($NH_3$) is supplied as a nitriding gas from the reaction gas nozzle 32, and activated chlorine is supplied from the gas discharge part 93d of the remote plasma generator 90. Also, the plasma generator 80 is mounted, and chlorine gas and ammonia gas are supplied while being ionized or radicalized by being activated.

First, as illustrated in Step 102 (S102), a wafer W is placed on the five recesses 24 of the turntable 2 in the vacuum chamber 1 of the above-described film deposition apparatus. Specifically, the gate valve (not illustrated) of the above-described film deposition apparatus is opened, and the wafers W are placed on the recesses 24 of the turntable 2 through the transfer port 15 (FIGS. 2 and 3) by the transfer arm 10 (FIG. 3) from the outside. This transfer is accomplished by raising and lowering the lifting pins (not illustrated) from the bottom side of the vacuum chamber 1 via through holes in the bottom of the recess 24 when the recess 24 stops at a position facing the transfer port 15. The wafers W are transferred to the five recesses 24 of the turntable 2 by intermittently rotating the turntable 2, and the wafers W are placed thereon.

Next, as illustrated in Step 104 (S104), the vacuum chamber 1 of the above-described film deposition apparatus is evacuated. Specifically, the gate valve of the deposition device described above is closed, and the vacuum pump 640 evacuates the vacuum chamber 1 to a degree of attainable vacuum.

Next, as illustrated in Step 106 (S106), the underlying film UF of SiN is deposited on a surface of a trench T of the wafer W. Specifically, the separation gas nozzles 41 and 42 discharge Ar gas that serves as the separation gas at a predetermined flow rate, and Ar gas is also discharged from the separation gas supply line 51 and the purge gas supply line 72 and 73 at a predetermined flow rate. DCS is then supplied from the reaction gas nozzle 31 (FIGS. 2 and 3), and ammonia gas is supplied from the reaction gas nozzle 32. The plasma generator 80 is also activated. Ammonia gas is activated by the plasma generator 80. Accordingly, the inside of the vacuum chamber 1 is controlled to a preset processing pressure by the pressure controller 650 (FIG. 1). Then, the wafer W is heated to, for example, 400 degrees C. by the heater unit 7 while rotating the turntable 2 clockwise at, for example, a rotation speed of 5 rpm. The rotation speed of the turntable 2 can be set to various rotation speeds depending on the intended use. In this manner, DCS supplied from the reaction gas nozzle 31 reacts with ammonia gas supplied from the reactor gas nozzle 32, and an underlying film UF of SiN is deposited.

Figure 12B:
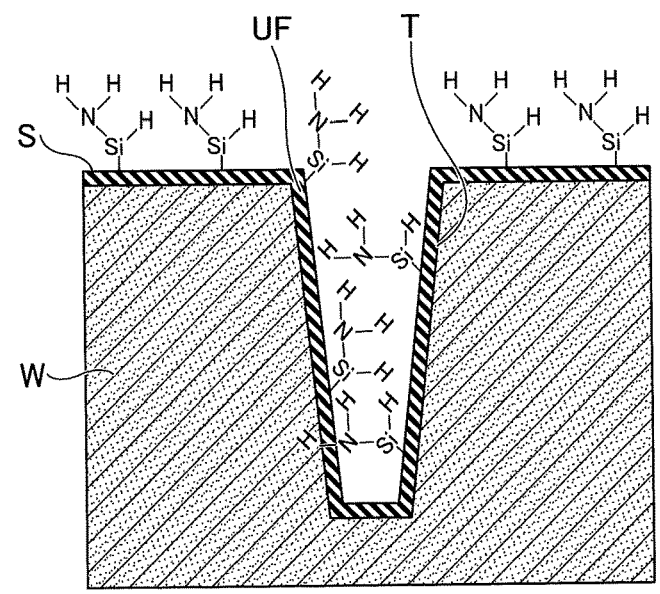

As a result of rotation of the turntable 2, the wafer W repeatedly passes through the third processing region P3, the separation region D, the first processing region P1, the separation region D, and the second processing region P2 in this order (see FIG. 3). This causes the underlying film UF to be deposited on the surface in which the trench T is formed including the bottom and side surfaces of the trench T of the wafer W, as illustrated in FIG. 12B. The underlying film UF thus formed is not a bottom-up film but a conformal film along the shape of the trench T. The state illustrated in FIG. 12B illustrates a state of the wafer W immediately after passing through the second processing region P2, and the top surface of the underlying film UF formed of SiN is terminated with an H group having an $NH_2$ structure. This is because the underlying film UF is nitrided with the $NH_3$-containing gas when the wafer W passes through the second processing region P2. Also, in the present application, the separation region D may be described as a purge region.

Next, as illustrated in Step 108 (S108), a SiN film with which the inside of the trench T of the wafer W is to be filled is deposited. Specifically, chlorine gas is supplied to the remote plasma generator 90 and the activated chlorine is supplied from the gas discharge part 93d of the remote plasma generator 90 by actuating the remote plasma generator 90. Although there are wafers W on which processing starts from each of the regions P1 to P3 and D due to the rotation of the turntable 2, for convenience, the state in which the wafer W passes from the third processing region P3 will be described.

Figure 12C:
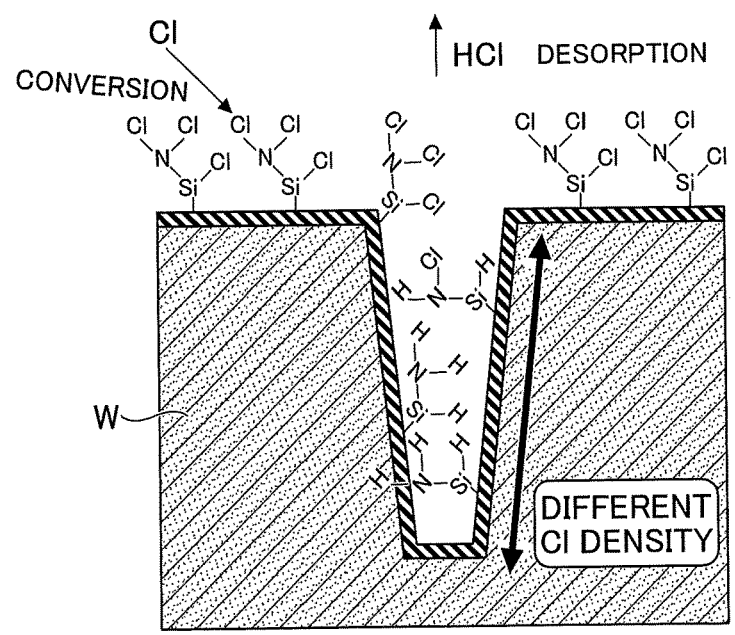

FIG. 12C illustrates an example of an adsorption inhibitor group forming step. In the adsorption inhibitor group forming step, when the wafer W passes through the third processing region P3, chlorine gas activated by plasma (chlorine radicals, chloride ions, and excited chlorine gas) is supplied to the underlying film UF in the trench T. Thus, as illustrated in FIG. 12C, chlorine gas reacts with the H group to form HCl and displaces the H group to form a Cl group termination. Such a Cl group forms an adsorption inhibitor group for chlorine-containing gases. Here, chlorine gas easily reaches the top surface S of the wafer W and the upper portion of the trench T, but not much at the deep portion of the trench T, that is, the lower part near the bottom. Because of the high aspect ratio of trench T, a lot of chlorine gas displace before reaching the deep portion of trench T. Accordingly, the Cl group, which is an adsorption inhibitor group, is formed at a high density on the top surface S of the wafer W and the upper portion of the trench T, but many H groups of the $NH_2$ structure remain at the lower portion of the trench T, resulting in a low density of the Cl group.

Figure 12D:
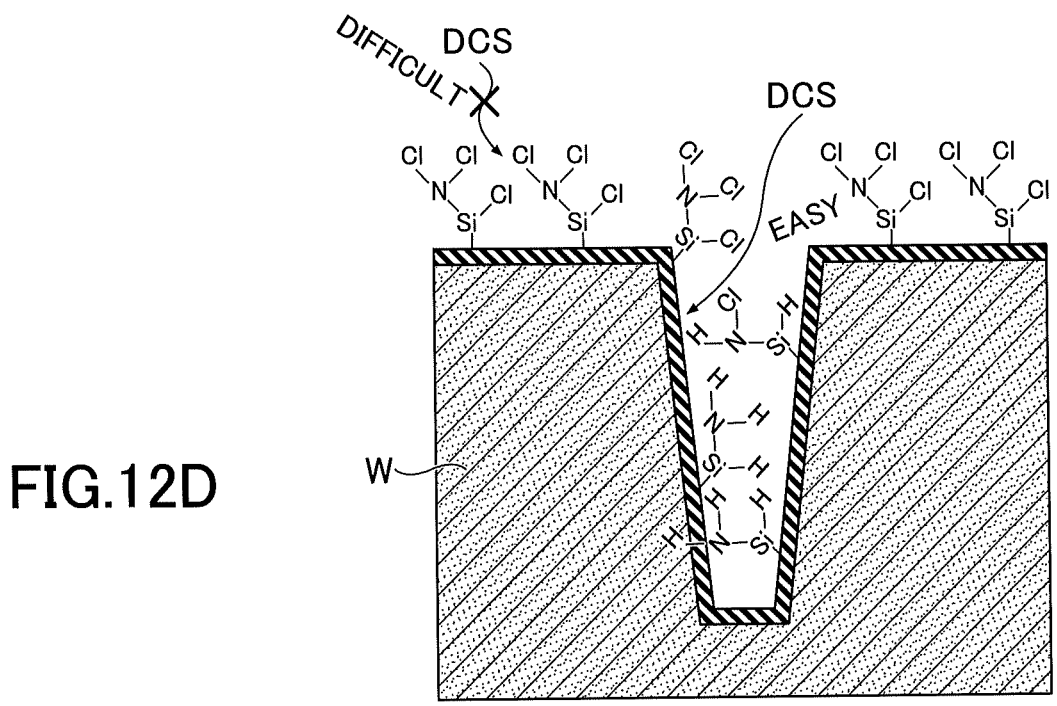

FIG. 12D is a diagram illustrating an example of a source gas adsorption process. In the source gas adsorption process, after the wafer W passes through the separation region D and is purged by a supplied purge gas, DCS is supplied to the wafer W when the wafer W passes through the first processing region P1. Thus, as illustrated in FIG. 12D, DCS adsorbs relatively little to the region where the 01 group, which is an adsorption inhibitor group, is present, but adsorbs a lot to the region where the adsorption inhibitor group is absent. Accordingly, a large amount of DCS adsorbs near the bottom inside of the trench T, but DCS does not adsorb a lot on the top surface S of the wafer W and on the upper portion of the trench T. That is, the source gas of DCS adsorbs near the bottom of the trench T at a high density, and DCS adsorbs at a low density on the upper portion of the trench T and the top surface of the wafer W.

Figure 12E:
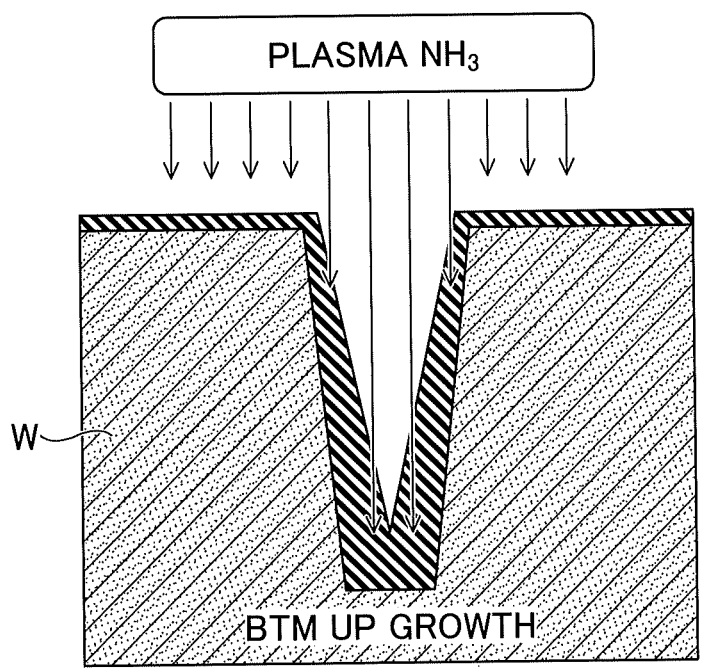

FIG. 12E illustrates an example of a nitride film deposition process. In the nitride film deposition process, after the wafer W passes through the separation region D and is purged by a supplied purge gas, $NH_3$ activated by plasma is supplied to the wafer W through the second processing region P2. Accordingly, as illustrated in FIG. 12E, by supplying $NH_3$ gas to the wafer W, DCS adsorbed in the trench T reacts with the supplied $NH_3$, and a SiN film, which is a nitride film, is formed as a reaction product. Because DCS absorbs on and around the bottom portion of the trench T, a SiN film is formed on and around the bottom portion of the trench T. Therefore, filling of the trench T with high bottom-up property as illustrated in FIG. 12E can be achieved.

Further, when the wafer W passes through the third processing region P3, the state again becomes as illustrated in FIG. 12C, and the Cl group, which is an adsorption inhibitor group, adsorbs to the upper portion of the trench T and the top surface of the wafer W.

Then, by repeatedly rotating the turntable 2 while supplying each reaction gas, the cycle illustrated in FIGS. 12C to 12E is repeated, and the SiN film is deposited from the bottom side without blocking the opening of the trench T. As illustrated in FIG. 12E, it is possible to form a V-shaped cross section while depositing a SiN film with high bottom-up properties without blocking the opening. Finally, the trench T can be filed with a seamless nitride film, and a high-quality nitride film can be embedded without generating voids.

Next, a purging process is performed as illustrated in Step 110 (S110). Specifically, the supply of DCS from the reaction gas nozzle 31 is stopped; the supply of chlorine to the remote plasma generator 90 is stopped; and the supply of activated chlorine from the gas discharge part 93d is stopped. In addition, the plasma generator 80 is stopped. Accordingly, Ar gas, which is a separation gas, is discharged from the separation gas nozzles 41 and 42 at a predetermined flow rate, Ar gas is also discharged from the separation gas supply line 51 and the purge gas supply lines 72 and 73 at a predetermined flow rate, and ammonia gas is supplied from the reaction gas nozzle 32 for 10 minutes. Ar gas is supplied to the remote plasma generator 90, but the remote plasma generator 90 is not in operation, so the supplied Ar is not activated.

Thereafter, the pressure in the vacuum chamber 1 is returned to atmospheric pressure by decreasing a degree of vacuum in the vacuum chamber 1 of the above-described film deposition apparatus, and a wafer W in which the trench T is filled with a film of SiN is removed from the vacuum chamber 1.

According to the film deposition method described above, selective film deposition with high bottom-up properties can be achieved by supplying activated chlorine gas to the upper portion of the trench T to form an adsorption inhibitor group while depositing a film by the ALD (Atomic Layer Deposition) method.

NH$_3$ does not have to be necessarily activated and supplied by being converted to plasma, and may be supplied without plasma if nitriding is possible.

According to such a film deposition method, a SiN film can be deposited from the bottom surface of the trench T, and a high-quality buried film without a void can be deposited.

Meanwhile, when a SiN film is deposited by the above-described film deposition method, the inventors have found that the film thickness of the SiN film decreases with time, that is, the film deposition rate of the SiN film is likely to decrease.

Figure 13:
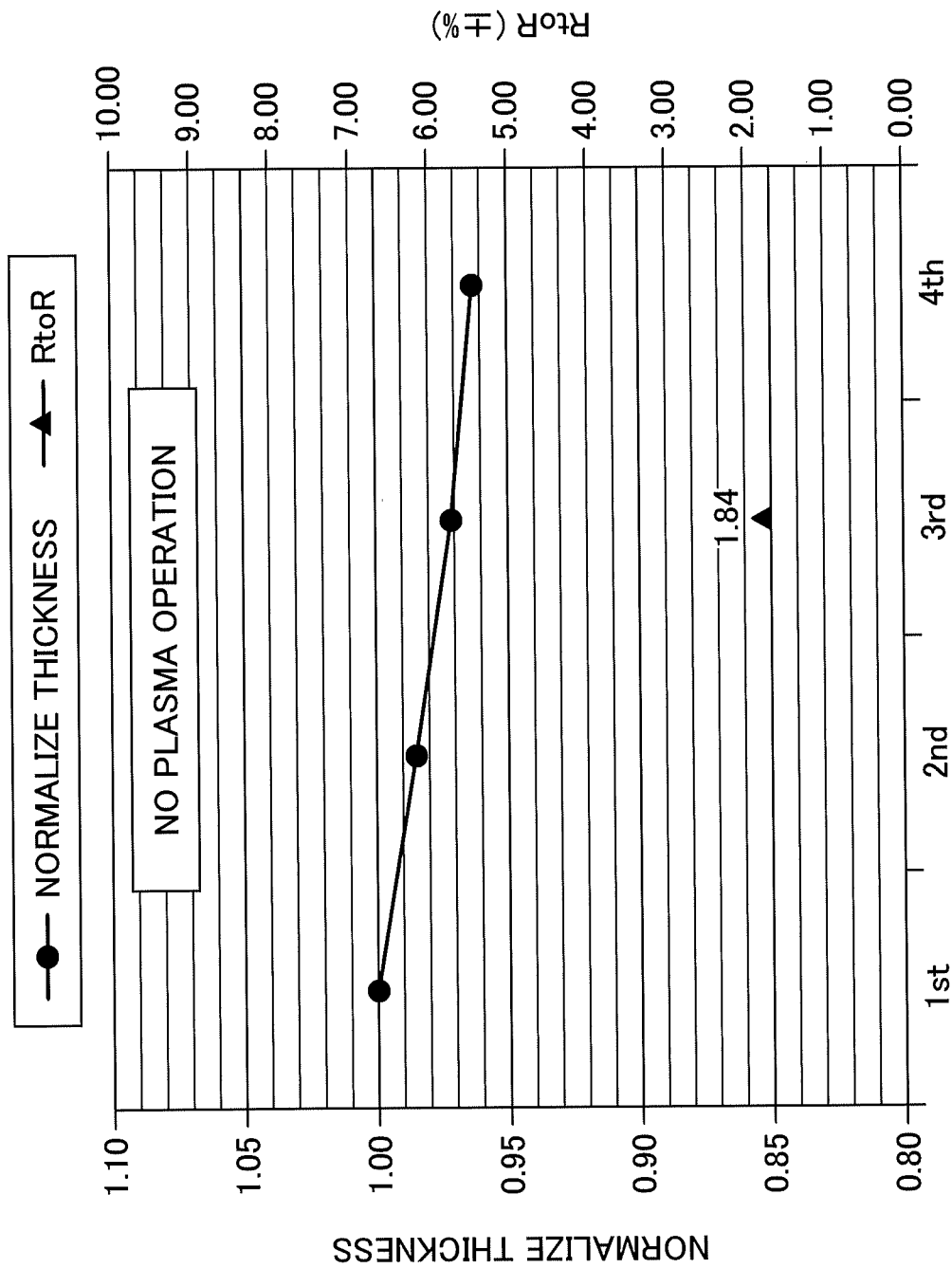
FIG. 13 is a diagram illustrating a number of operations and a change in film thickness of a normalized SiN film when the SiN film is deposited using activated chlorine gas.

FIG. 13 is a diagram showing the number of operations and the change in the film thickness of the normalized SiN film when the SiN film is deposited using activated chlorine gas. Here, the number of operations means the number of times that the wafer W is carried into the vacuum chamber 1, placed on the turntable 2, a SiN film is deposited, and the deposited wafer W is carried out of the vacuum chamber 1. In other words, about 5 to 6 wafers W are placed on the turntable 2 to form a SiN film, but after one operation, 5 to 6 wafers W, which have been formed, are carried out, and the next batch of 5 to 6 wafers W is carried in, and the same film deposition process is repeated.

As illustrated in FIG. 13, assuming that the film thickness of the first operation is 1.00, the film thickness of the second operation is 0.985, the film thickness of the third operation is 0.970, and the film thickness of the fourth operation is about 0.965. This may be because the state of the activated chlorine gas varies with the number of operations.

In the case of the film deposition property as shown in FIG. 13, if the film deposition rate of the SiN film is gradually lowered when the film deposition is continued, the filing of the trench T formed in the wafer W becomes worse, and the yield and the like decrease, which is not preferable. For this reason, there is a demand for a film deposition method that can stably deposit a SiN film with preferable reproducibility without decreasing the film deposition rate of the SiN film even if the film deposition is continued.

Figure 14A:
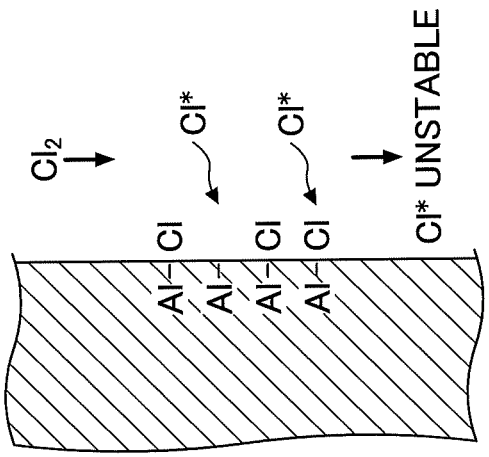
FIGS. 14A to 14C are diagrams illustrating a phenomenon thought to occur in a showerhead part of a remote plasma generator.
Figure 14B:
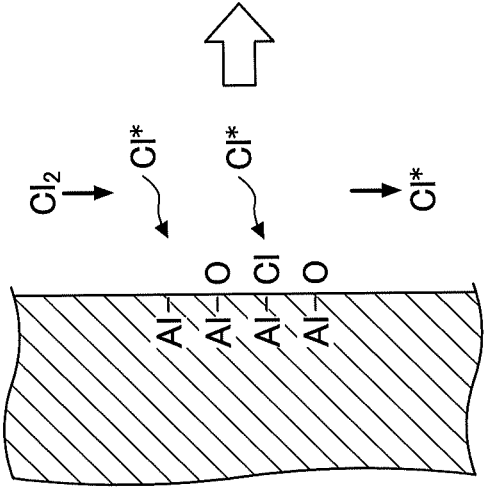
Figure 14C:
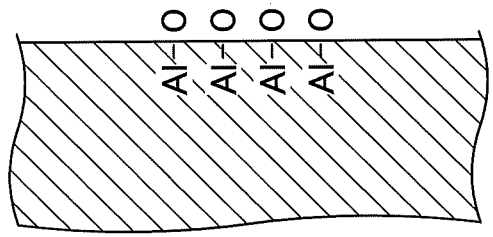

FIGS. 14A to 14C are diagrams illustrating a phenomenon thought to occur at a showerhead part 93 in a remote plasma generator 90.

As described above, the showerhead part 93 of the remote plasma generator 90 or the like is made of aluminum (Al), and the surface of the remote plasma generator 90 is oxidized so as to be terminated with O atoms. In depositing the SiN film, chlorine gas is supplied to the showerhead part 93 of the remote plasma generator 90.

FIG. 14A illustrates the initial state of the inner wall surface of the showerhead part 93 of the remote plasma generator 90. Initially, the inner wall surface of the showerhead part 93 is formed by aligning AlO terminated with O atoms.

FIG. 14B illustrates an example of a state in which chlorine gas is activated in the remote plasma generator 90 and supplied from the showerhead part 93. As illustrated in FIG. 14B, the O-terminated inner wall surface is partially replaced by Cl atoms. This is because activated Cl atoms such as highly reactive Cl radicals collide with the inner wall surface of the showerhead part 93 and displace O atoms.

Specifically, the showerhead part 93 and the like of the remote plasma generator 90 are made of aluminum (Al), and when a SiN film is deposited, chlorine gas is supplied to the showerhead part 93 of the remote plasma generator 90. Because the supplied chlorine gas is activated by the remote plasma generator 90, chlorine is bonded to Al of a surface of the showerhead part 93 and the like, and an AlCl bond is formed on the surface as illustrated in FIG. 14B.

FIG. 14C is a diagram illustrating an example of a state of the inner wall surface of the plasma generation part 91 when a plurality of operations is performed by continuing the film deposition process. As illustrated in FIG. 14C, the O atom of AlO of a considerable portion is replaced by the Cl atom, and the supply amount of activated chlorine gas from the showerhead part 93 changes. If such a change occurs over time, the supply of chlorine radicals may change, and as the number of operations is followed, the supply amount of chlorine radicals may change and the uniformity of film thickness between operations may not be maintained.

Thus, when an AlCl bond is formed on the surface of the showerhead part 93 and the like, the amount of activated Cl adhering to a surface such as a showerhead portion 93 gradually decreases as shown in FIG. 14C when a SiN film is deposited. Thus, the amount of activated Cl supplied to the third processing region P3 is gradually increased. As the activated Cl supplied to the third processing region P3 increases, the film thickness of the deposited SiN film gradually decreases because the activated Cl also acts as an etching gas. Based on this mechanism, it is assumed that the thickness of the SiN film gradually decreases as the film is deposited. In some cases, the showerhead part 93 of the remote plasma generator 90 is aluminized. In this case, it is considered that the O, which is bonded to Al on the surface of the showerhead part 93, is replaced by activated Cl to form a bond of AlCl.

Therefore, in the film deposition method according to the present embodiment, oxygen radicals are supplied to the interior of the remote plasma generator 90 between the operations, and an oxygen purging process is performed to supplement the lost oxygen by replacing the chlorine with oxygen.

FIGS. 15A to 15D are diagrams for explaining an oxygen purging process of a film deposition method according to the present embodiment.

Figure 15D:
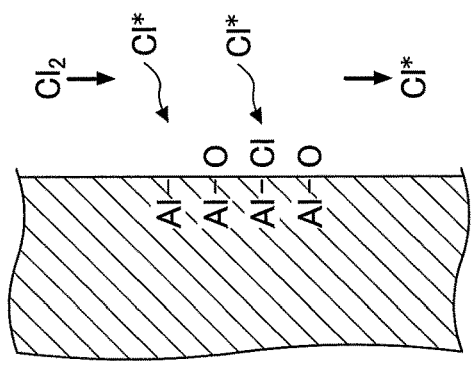
FIGS. 15A to 15D are diagrams for explaining an oxygen purging process of a film deposition method according to the present embodiment.
Figure 15C:
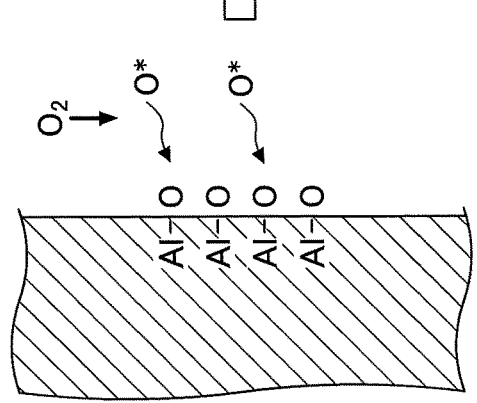
Figure 15B:
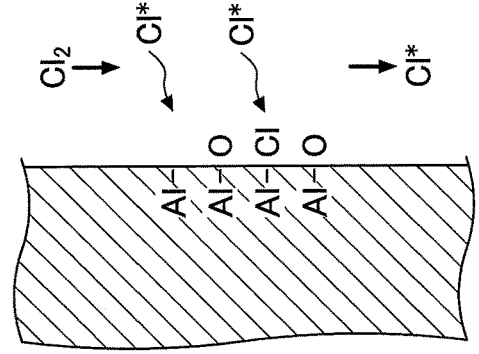
Figure 15A:
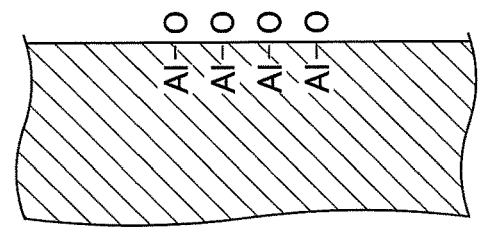

FIG. 15A illustrates the initial state of the showerhead part 93 of the plasma generator 90. When the showerhead part 93 is formed of aluminum, the surface is naturally oxidized and terminated with O atoms.

FIG. 15B illustrates an example of a state in which chlorine gas is activated. As illustrated in FIG. 15B, while the chlorine gas is activated to produce chlorine radicals, the inner wall surface of the showerhead part 93 is attacked by the chlorine radicals generated in the remote plasma generator 90, partially replacing the oxygen atom with a chlorine atom, resulting in a chlorine atom termination.

FIGS. 15A and 15B are similar to FIGS. 14A and 14B.

FIG. 15C illustrates an example of an oxygen purging process. In the oxygen purging process, the activated oxygen gas is supplied to the inside of the remote plasma generator 90; the showerhead part 93 replaced by the chlorine atom is replaced by oxygen, and the showerhead part 93 terminated with the O atom is restored to its initial state. This allows the state of the showerhead part 93 to be initialized.

Now, if oxygen gas is supplied while the remote plasma generator 90 is operating, the oxygen gas is activated; oxygen radicals are generated; and the reactivity is increased so that the chlorine atom can be efficiently replaced by the oxygen atom. Thus, it is preferable to supply oxygen gas into the remote plasma generator 90 when the remote plasma generator 90 is in operation. In this case, the activated oxygen purging process may be referred to as an activated oxygen purging process because the inside wall surface of the showerhead part 93 is purged with activated oxygen.

The activated oxygen purging process is preferably performed in a state in which the wafer W is not present in the vacuum chamber 1. Because a nitride film is deposited on the wafer W, when oxygen leaks from the showerhead part 93, the nitride film deposited on the wafer W is oxidized and degrades the quality.

From this point of view, the oxygen purging process preferably takes place between operations where the wafer W is not present in the vacuum chamber 1. That is, it is preferable that the oxygen purging process is not performed when the wafer W is delivered into the vacuum chamber 1 or the film deposition process is performed after the wafer W is removed.

Because a certain amount of period of time is required between the removal of the deposited wafer W and loading of the next new wafer, the oxygen purging process may be performed during the period of time, or if the period of time is insufficient, it may be necessary to provide a certain amount of period of time for the oxygen purging process. The method for setting the oxygen purging process may be appropriately determined in relation to the specific film deposition process.

FIG. 15D is a diagram illustrating an example of a condition of the wall surface inside the showerhead part 93 in the next operation during the film deposition process. Thus, when the activated chlorine gas is generated again in the next film deposition process, some of the oxygen atoms are replaced by chlorine atoms.

Therefore, when the process of FIG. 15D is completed, the oxygen purging process illustrated in FIG. 15C is performed again. Thus, by repeating FIGS. 15C and 15D, or FIGS. 15B and 15C, the inner wall surface of the showerhead part 93 can always be initialized to be a surface terminated with oxygen.

Thus, the inside of the showerhead part 93 can be kept constant, and even if the number of operations is increased, the film thickness difference between the operations can be reduced, and the film deposition can be continued with a constant film thickness.

Although the behavior of the showerhead part 93 made of aluminum has been mainly described, it is believed that a similar phenomenon occurs at other locations in the remote plasma generator 90, and it is considered that it is effective not only for the showerhead part 93 but also for the entire remote plasma generator 90.

Film Deposition Method According to Embodiment of the Present Embodiment

Figure 16:
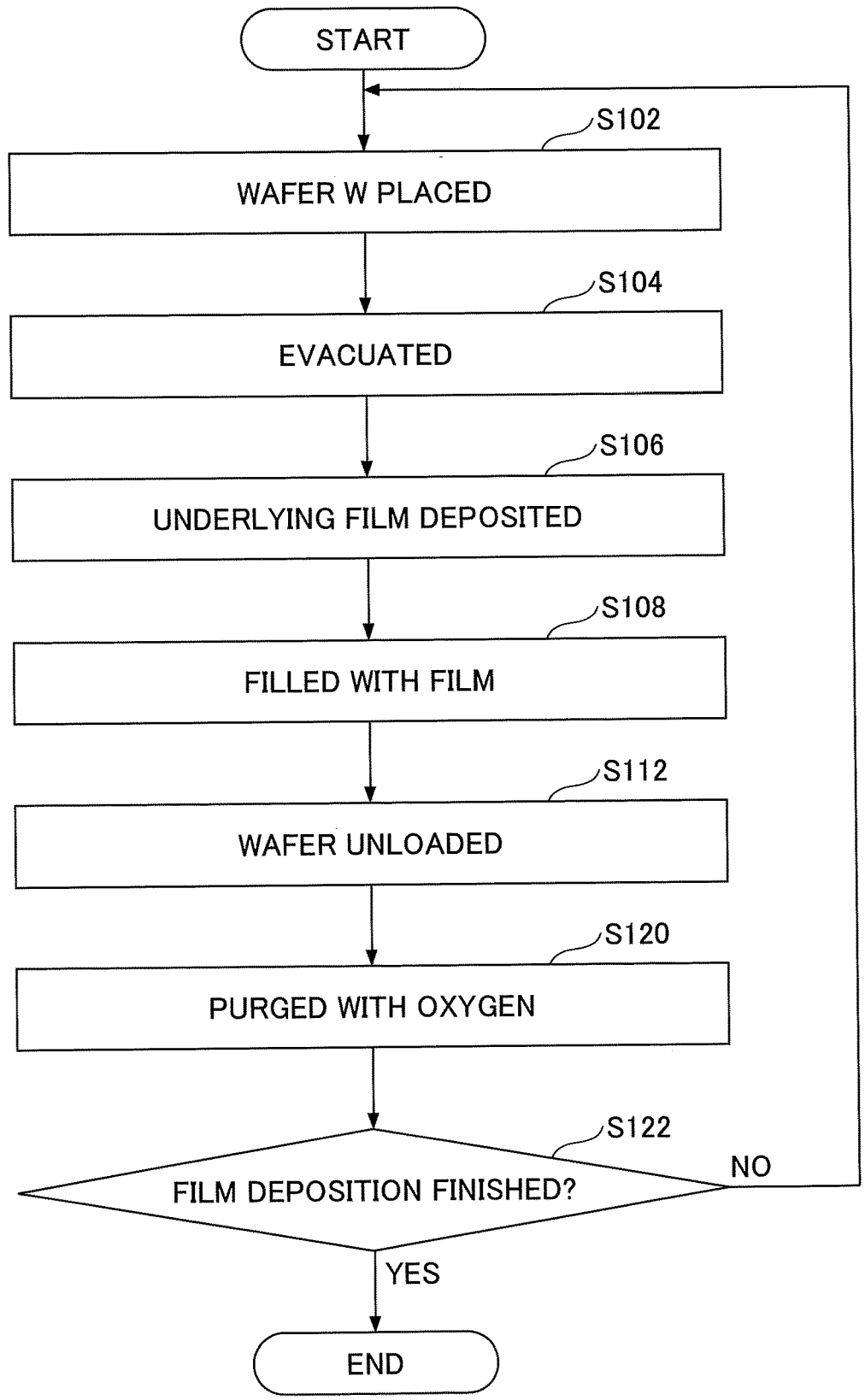
FIG. 16 is a flowchart illustrating a process of depositing a SiN film by a film deposition method according to an embodiment.

Next, a film deposition method according to the present embodiment will be described. The film deposition method according to the present embodiment is a method of depositing a SiN film using the above-described film deposition apparatus, and will be described with reference to FIG. 16. FIG. 16 is a flowchart illustrating a process of forming a SiN film by a film deposition method according to an embodiment.

First, as illustrated in Step 102 (S102), wafers W are placed on the five recesses 24 of the turntable 2 in the vacuum chamber 1 of the above-described film deposition apparatus.

Next, as illustrated in Step 104 (S104), the vacuum chamber 1 of the above-described film deposition apparatus is evacuated.

Next, as illustrated in Step 106 (S106), the underlying film UF of SiN is deposited on the surface of the wafer W in which the trench T is formed.

Next, as illustrated in Step 108 (S108), a film of SiN is deposited on the inside of the trench T of the wafer W. Specifically, chlorine gas is supplied to the remote plasma generator 90, and the activated chlorine gas is supplied from the gas discharge part 93d of the remote plasma generator 90 by actuating the remote plasma generator 90.

When the film is deposited up to a predetermined thickness and the trench T is filled with the nitride film, the supply of the source gas and the activated chlorine gas is stopped. In addition, when only the nitriding gas is supplied in the post treatment, the nitriding gas is continuously supplied from the reaction gas nozzle 32.

When all the film deposition processes are completed, the rotation of the turntable 2 is stopped, and the wafer W on which the film deposition process has been performed is carried out of the vacuum chamber 1. Therefore, the wafer W is not present in the vacuum chamber 1.

Next, an oxygen purge is performed as illustrated in Step 120 (S120). Specifically, the supply of oxygen to the remote plasma generator 90 is stopped. When the remote plasma generator 90 is activated, oxygen gas is activated to enhance the oxidation effect. This causes the inside of the remote plasma generator 90, which includes a showerhead part 93, to be oxidized and the chlorine termination to be replaced with an oxygen termination, thereby returning the inside of the remote plasma generator 90 to the initial state.

In Step 122 (S122), it is determined whether or not the film deposition process is completed. If the process is not completed, the process returns to Step 102 (S102), and the next lot of wafers W is carried into the vacuum chamber 1 and placed on the turntable 2. Steps 104 through 122 are then repeated.

Between the operations, the oxygen purge or activated oxygen purge of Step 120 is performed so that the inside of the remote plasma generator 90 can always be initialized, and film deposition can continue with a uniform thickness even after the film deposition processes are repeated.

Here, NH$_3$ does not have to be necessarily activated and supplied by being converted to plasma, and may be supplied without plasma if nitriding is possible.

Working Example

Figure 18:
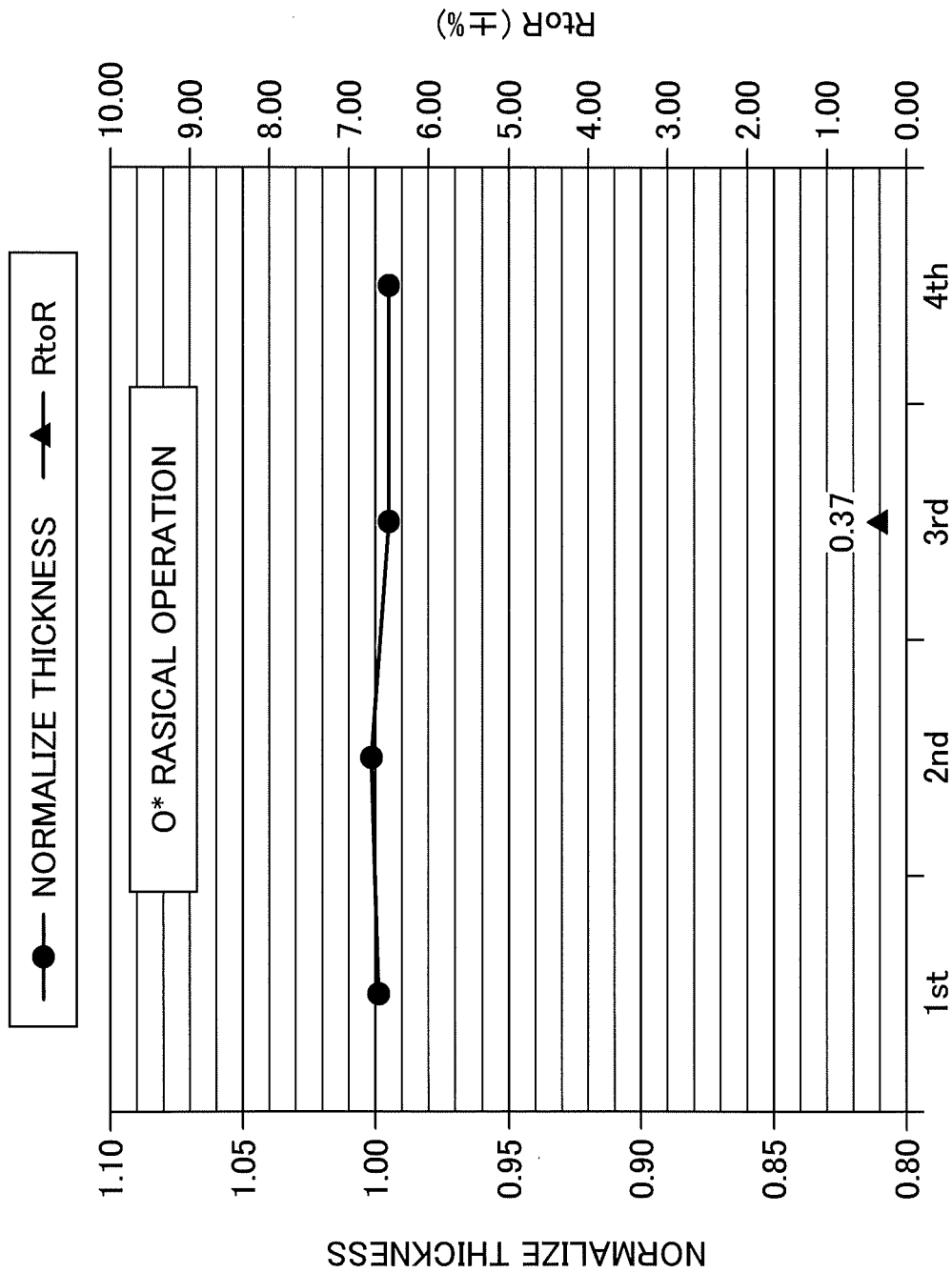
FIG. 18 is a diagram illustrating results of an embodiment.

FIG. 17 is a table for explaining the operation conditions of a working example of performing the film deposition method according to the present embodiment, and FIG. 18 is a diagram for explaining the results of the working example.

The film deposition process in the working example was performed according to the conditions illustrated in FIG. 17. That is, in the film deposition process, the rotation speed of the turntable 2 is set to 20 rpm, the temperature of the wafer W is set to 350 degrees C., and the pressure is set to 2.0 Torr. The flow rate of chlorine gas was 5 sccm; the Ar flow rate of the remote plasma generator 90 was set to 4000 sccm; ammonia was supplied from the reaction gas nozzle 32 at a flow rate of 2000 sccm, and DCS was supplied from the reaction gas nozzle 31 at a flow rate of 1000 sccm. The deposition period of time was set at 3600 seconds.

In the oxygen purge, the temperature and the pressure of the wafer W were set to 350 degrees C. and 2.0 Torr, respectively, which were the same as those in the film deposition process. The flow rate of the oxygen purge gas was set to be 300 sccm, and the flow rate of Ar of the remote plasma generator 90 was set to be 4000 sccm. The film deposition period of time was set at 600 seconds.

FIG. 18 is a diagram illustrating a normalized result of the working example. As illustrated in FIG. 18, for the first to fourth operations, the film thickness was approximately 1.0, and the film thickness remained constant even when the number of operations is increased.

Thus, the present working example has indicated that the film thickness between the operations can be kept constant by the film deposition method according to the present embodiment.

In the meantime, although the description of the film deposition method includes the step of depositing the underlying film, a wafer W on which the underlying film UF is deposited on the surface may be used. In this case, Step 106 is omitted, and Step 102, Step 104, Step 108, and Step 120 are performed in this order. The underlying film UF may be a silicon oxide film in addition to the silicon nitride film.

In the film deposition method according to the present embodiment, an example in which a silicon nitride film is deposited has been described. However, it is possible to form a metal nitride film, such as TiN and AlN, by using a gas containing a metal such as $TiCl_4$ and $AlCl_3$ and chlorine as the source gas. In addition to Ti and Al, various metallic elements, such as zirconium (Zr), hafnium (Hf) and the like, and the source gas containing chlorine can be used to perform the filling deposition of a depression with the metal nitride film.

According to the present disclosure, when a film is deposited using activated chlorine gas, the supply amount of activated chlorine gas can be kept constant even when the number of operations of the film deposition is increased.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A film deposition method, comprising steps of:
   activating chlorine gas in a plasma generator;
   forming an adsorption inhibitor group by adsorbing the activated chlorine gas on a surface of a substrate in a processing chamber;
   adsorbing a source gas containing chlorine and one of silicon and a metal on a region without the adsorption inhibitor group of the surface of the substrate;
   depositing a nitride film by supplying a nitriding gas to the surface of the substrate and causing the nitriding gas to react with the source gas;
   carrying the substrate on which the nitride film is deposited out of the processing chamber; and
   purging an inside of the plasma generator with activated oxygen gas.

2. The film deposition method as claimed in claim 1, wherein the steps of forming the adsorption inhibitor group, adsorbing the source gas and depositing the nitride film are performed as one cycle, and wherein the nitride film is deposited by repeating the one cycle a predetermined number of times.

3. The film deposition method as claimed in claim 2, wherein the step of activating the chlorine gas is continuously performed during the one cycle.

4. The film deposition method as claimed in claim 1, further comprising a step of:
   carrying a second substrate into the processing chamber after the step of purging the inside of the plasma generator with the activated oxygen gas.

5. The substrate processing method as claimed in claim 4, wherein the steps of activating the chlorine gas, forming the adsorption inhibitor group, adsorbing the source gas, depositing the nitride film, purging the inside of the plasma generator with the activated oxygen gas and carrying the second substrate into the processing chamber are repeated multiple times.

6. The film deposition method as claimed in claim 1, wherein the metal includes one of titanium and aluminum.

7. The film deposition method as claimed in claim 1, wherein the substrate is a silicon substrate.

8. The film deposition method as claimed in claim 1,
   wherein the substrate includes a depression pattern formed therein, and
   wherein the depression pattern is filled with the nitride film deposited in the step of depositing the nitride film.

9. The film deposition method as claimed in claim 8,
   wherein the activated chlorine gas adsorbs on an upper portion of the depression pattern and a flat surface of the substrate without the depression pattern, and
   wherein the region without the adsorption inhibitor group includes a bottom surface of the depression pattern.

10. The film deposition method as claimed in claim 1, further comprising:
    preliminarily forming an underlying film on the surface of the substrate.

11. The film deposition method as claimed in claim 10, wherein the underlying film is one of a silicon nitride film and a silicon oxide film.

12. The film deposition method as claimed in claim 1, further comprising:
    depositing an underlying film on the surface of the substrate before the step of activating the chlorine gas,
    wherein the step of depositing the underlying film comprises steps of:
    adsorbing a silicon-containing gas on the surface of the substrate by supplying the silicon-containing gas, and
    depositing a silicon nitride film by supplying the nitriding gas to the surface of the substrate and causing the nitriding gas to react with the silicon-containing gas adsorbed on the surface of the substrate.

13. The film deposition method as claimed in claim 12, wherein the underlying film is deposited by repeating the steps of adsorbing the silicon-containing gas and depositing the silicon nitride film a predetermined number of times.

14. The film deposition method as claimed in claim 1, wherein the nitriding gas is activated by plasma.

15. The film deposition method as claimed in claim 14,
    wherein purge regions configured to purge the surface of the substrate are disposed between the activated chlorine adsorption region and the source gas adsorption region, and between the source gas adsorption region and the nitriding region, and further comprising a step of:
    purging the surface of the substrate between the steps of forming the adsorption inhibitor group and adsorbing the source gas, and between the steps of adsorbing the source gas and depositing the nitride film.

16. The film deposition method as claimed in claim 1,
wherein the substrate is arranged along a circumferential direction on a turntable,
wherein an activated chlorine adsorption region, a source gas adsorption region and a nitriding region are arranged in this order apart from each other along a rotational direction of the turntable, and
wherein the steps of forming the adsorption inhibitor group, adsorbing the source gas and depositing the nitriding film are sequentially repeated by rotating the turntable in the rotational direction.

17. The film deposition method as claimed in claim 1,
wherein the activated chlorine gas is generated in a remote plasma generator, and
wherein the activated oxygen gas is generated in the remote plasma generator.

* * * * *